(12) United States Patent
Kajiya et al.

(10) Patent No.: US 12,099,221 B2
(45) Date of Patent: Sep. 24, 2024

(54) OPTICAL FILTER AND LIGHT-EMITTING DEVICE

(71) Applicant: Dexerials Corporation, Tokyo (JP)

(72) Inventors: Shunichi Kajiya, Tokyo (JP); Hiroshi Tazawa, Tokyo (JP); Kazuhiko Noda, Tokyo (JP); Kyoko Sakurai, Tokyo (JP)

(73) Assignee: Dexerials Corporation, Tokyo (JP)

( * ) Notice: Subject to any disclaimer, the term of this patent is extended or adjusted under 35 U.S.C. 154(b) by 676 days.

(21) Appl. No.: 17/286,884

(22) PCT Filed: Oct. 23, 2019

(86) PCT No.: PCT/JP2019/041538
§ 371 (c)(1),
(2) Date: Apr. 20, 2021

(87) PCT Pub. No.: WO2020/085387
PCT Pub. Date: Apr. 30, 2020

(65) Prior Publication Data
US 2021/0382214 A1 Dec. 9, 2021

(30) Foreign Application Priority Data

Oct. 24, 2018 (JP) .................................. 2018-200171
Mar. 22, 2019 (JP) .................................. 2019-055115

(51) Int. Cl.
*G02B 5/22* (2006.01)
(52) U.S. Cl.
CPC ...................................... *G02B 5/22* (2013.01)
(58) Field of Classification Search
CPC . G02B 5/22; G02B 1/04; G02B 5/223; G02B 5/201; H01L 33/58; H10K 50/125; H10K 50/85; H10K 50/86
See application file for complete search history.

(56) References Cited

U.S. PATENT DOCUMENTS

| | | | | |
|---|---|---|---|---|
| 5,204,160 A | * | 4/1993 | Rouser | ..................... G02B 5/00 351/159.63 |
| 6,398,370 B1 | * | 6/2002 | Chiu | ..................... G02B 5/003 428/167 |

(Continued)

FOREIGN PATENT DOCUMENTS

| | | |
|---|---|---|
| JP | 2003315547 A | 11/2003 |
| JP | 2008282602 A | 11/2008 |

(Continued)

OTHER PUBLICATIONS

Jun. 17, 2022, Office Action issued by the China National Intellectual Property Administration in the corresponding Chinese Patent Application No. 201980068599.3.

(Continued)

*Primary Examiner* — Derek S. Chapel
(74) *Attorney, Agent, or Firm* — KENJA IP LAW PC

(57) ABSTRACT

An optical filter includes a transmission portion transmitting light and an absorption portion absorbing light between a plane of incidence and a plane of emission, and the volume of the transmission portion is larger than the volume of the absorption portion. For the optical filter, when the transmission spectrum $S_0$ of light incident at an incidence angle of 0° and the transmission spectrum $S_{60}$ of light incident at an incidence angle of 60° are superimposed, the transmittance (%) at an incidence angle of 60° is lower than the transmittance (%) at an incidence angle of 0° by 15% or more for a first wavelength band, and the difference between the transmittance (%) at an incidence angle of 60° and the transmittance (%) at an incidence angle of 0° is 10% or less for a second wavelength band.

6 Claims, 15 Drawing Sheets

(56) References Cited

U.S. PATENT DOCUMENTS

| | | | | |
|---|---|---|---|---|
| 8,427,768 B2* | 4/2013 | Park | ................ | G02F 1/133514 348/786 |
| 2011/0205632 A1* | 8/2011 | Park | ................ | G02F 1/133514 359/599 |
| 2015/0009563 A1* | 1/2015 | Lauters | ................ | G02B 5/305 359/485.03 |
| 2018/0017721 A1* | 1/2018 | Nagaya | ................ | G01J 1/0403 |
| 2019/0346600 A1* | 11/2019 | Wheatley | ............... | G02B 5/201 |

FOREIGN PATENT DOCUMENTS

| | | |
|---|---|---|
| JP | 2009139403 A | 6/2009 |
| JP | 2010072653 A | 4/2010 |
| JP | 2010122435 A | 6/2010 |
| JP | 2011085937 A | 4/2011 |
| JP | 2013214365 A | 10/2013 |
| JP | 2016170271 A | 9/2016 |
| JP | 2017054129 A | 3/2017 |
| KR | 100787869 B1 | 12/2007 |

OTHER PUBLICATIONS

Apr. 3, 2023, Office Action issued by the Korean Intellectual Property Office in the corresponding Korean Patent Application No. 10-2021-7011357.

Dec. 10, 2019, International Search Report issued in the International Patent Application No. PCT/JP2019/041538.

Apr. 27, 2021, International Preliminary Report on Patentability issued in the International Patent Application No. PCT/JP2019/041538.

* cited by examiner

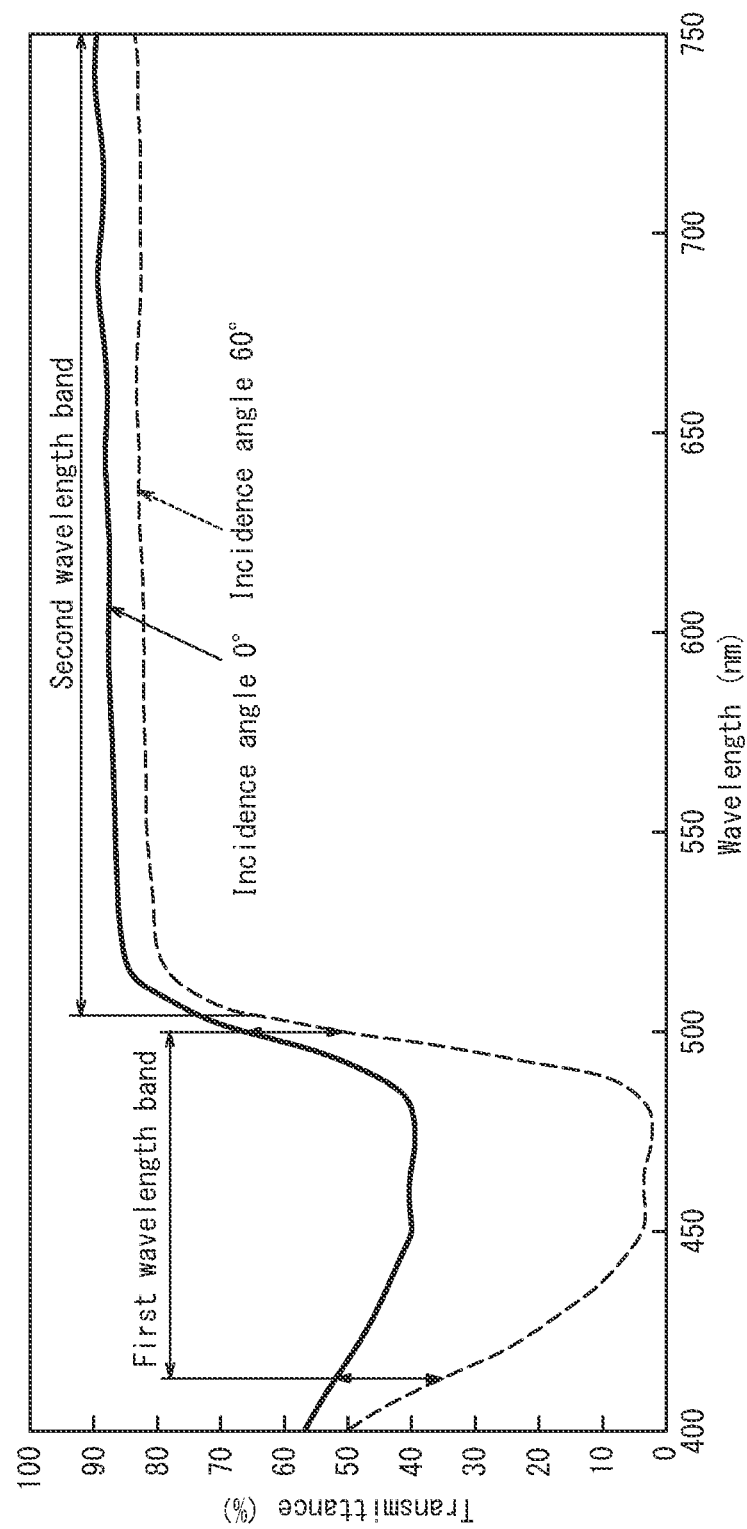

Example 1-3

Comparative Example 1-1

OPTICAL FILTER AND LIGHT-EMITTING DEVICE

TECHNICAL FIELD

The present disclosure relates to an optical filter and a light-emitting device.

BACKGROUND

In light-emitting devices including image display devices, light-emitting diodes (LEDs) or organic LEDs (also referred to as OLEDs) are mostly used as light-emitting elements. Since LEDs and OLEDs are significantly suitable for mass production and also exhibit excellent optical characteristics such as high luminance, they are rapidly becoming more widespread in the market.

Here, light-emitting devices having LEDs, OLEDs, or the like are often provided with a filter for adjusting the optical characteristics, particularly the optical characteristics for specific wavelength regions depending on use. In recent years, various correction filters are developed.

For example, JP 2003-315547 A (PTL 1) discloses a filter (band-pass filter) obtained by stacking dielectric films having different refractive indices to a thickness such that light of specific wavelengths is interfered thereby selectively reflecting or transmitting specific light.

Further, for example, JP 2013-214365 A (PTL 2) describes that addressing the problem of shifting of the waveform to the short wavelength side in the emission profile of an organic EL display device or the like, caused when the screen view direction is changed from front to oblique; a filter layer having the minimum transmittance for a region of wavelengths shorter than the wavelengths of light corresponding to the maximum emission intensity is provided on the display screen.

CITATION LIST

Patent Literature

PTL 1: JP 2003-315547 A
PTL 2: JP 2013-214365 A

SUMMARY

Technical Problem

Now, the emission intensity of light of specific wavelengths emitted from self-emitting light sources such as LEDs, OLEDs, etc. that is perceived by a viewer from the front may be different from that from an oblique direction. For example, for independently controlled RGB emission active matrix OLEDs, as illustrated in FIG. 1A and FIG. 1B, although the wavelength band of the emitted light perceived by a viewer from the front (FIG. 1A) and that from an oblique direction (FIG. 1B, viewed obliquely at an angle of 30°) are almost the same, the intensity of the emission of blue light (wavelength: approximately 435 nm to 480 nm) relatively greatly varies (hereinafter, such characteristics, not limited to blue, may be referred to as "angular dependence of emission intensity"). Such angular dependence of emission intensity would affect the quality of a light-emitting device.

Therefore, for the above-mentioned light sources, the colors (relative emission intensities of R (red), G (green), and B (blue)) viewed from the front and in an oblique direction are required to be close to each other as possible; accordingly, there has been a demand for a filter having different correction effects for specific wavelength regions depending on the angle of incident light.

PTL 2 above refers to the difference between the hue viewed by a viewer from the front and the hue viewed from an oblique direction. However, as described above, PTL 2 describes correcting the shift of the emission wavelength band to the short wavelength side, caused when the screen is viewed from an oblique direction and does not refer to the angular dependence of the emission intensity. Further, the filter layer described in PTL 2 does not meet the above requirements.

The present disclosure is directed at solving the conventional problems described above. Thus, it could be helpful to provide an optical filter having different color correction effects for specific wavelength regions depending on the angle of incident light, and a light-emitting device that includes the optical filter, with reduced angular dependence of the emission intensity of a light source.

Solution to Problem

We thus provide the following features.

<1> An optical filter includes a transmission portion transmitting light and an absorption portion absorbing light between a plane of incidence and a plane of emission,
 wherein a volume of the transmission portion is larger than a volume of the absorption portion, and
 when a transmission spectrum $S_0$ of light incident at an incidence angle of 0° and a transmission spectrum $S_{60}$ of light incident at an incidence angle of 60° are superimposed, in the optical filter,
  a transmittance (%) at an incidence angle of 60° is lower than a transmittance (%) at an incidence angle of 0° by 15% or more for a first wavelength band, and
  a difference between a transmittance (%) at an incidence angle of 60° and a transmittance (%) at an incidence angle of 0° is 10% or less for a second wavelength band.

<2> The optical filter according to <1> above, wherein a maximum absorption wavelength of the absorption portion is within a range of 380 nm to 780 nm.

<3> The optical filter according to <1> or <2> above, wherein when a transmission spectrum $S_{30}$ for light incident at an incidence angle of 30° is additionally superimposed on the transmission spectrum $S_0$ and the transmission spectrum $S_{60}$, a difference between the transmittance (%) at an incidence angle of 30° and the transmittance (%) at an incidence angle of 0° is 5% or less for the first wavelength band.

<4> The optical filter according to any one of <1> to <3> above, wherein the transmission portion contains a UV curable resin, and the absorption portion contains a UV curable resin and a light absorber.

<5> The optical filter according to any one of <1> to <4> above, wherein a plurality of grooves are provided to form a stripe pattern in the transmission portion, and the plurality of grooves are stopped with the absorption portion.

<6> The optical filter according to any one of <1> to <5> above, wherein the optical filter is provided with a first layer including the transmission portion and the absorption portion, and a second layer including the transmission portion and the absorption portion,
 a plurality of grooves are provided to form a stripe pattern in the transmission portion in each of the first layer and the second layer, and the plurality of grooves are stopped with the absorption portion, and the plurality of grooves in the first layer and the plurality of grooves in the second layer cross in plan view.

<7> The optical filter according to <5> or <6> above, wherein the plurality of grooves have a trapezoidal cross section, and have a pitch P1 of 3 μm to 500 μm.

<8> A light-emitting device comprising a light source and the optical filter according to any one of <1> to <7> above.

Advantageous Effect

This disclosure can provide an optical filter having different color correction effects for specific wavelength regions depending on the angle of incident light, and a light-emitting device that includes the optical filter, with reduced angular dependence of the emission intensity of a light source.

BRIEF DESCRIPTION OF THE DRAWINGS

In the accompanying drawings:

FIG. 3 illustrates the transmission spectrum $S_0$ of light incident on the optical filter according to the embodiment of this disclosure at an incidence angle of 0° and the transmission spectrum $S_{60}$ of light incident thereon at an incidence angle of 60 on one coordinate plane;

DETAILED DESCRIPTION

Figure 1A:
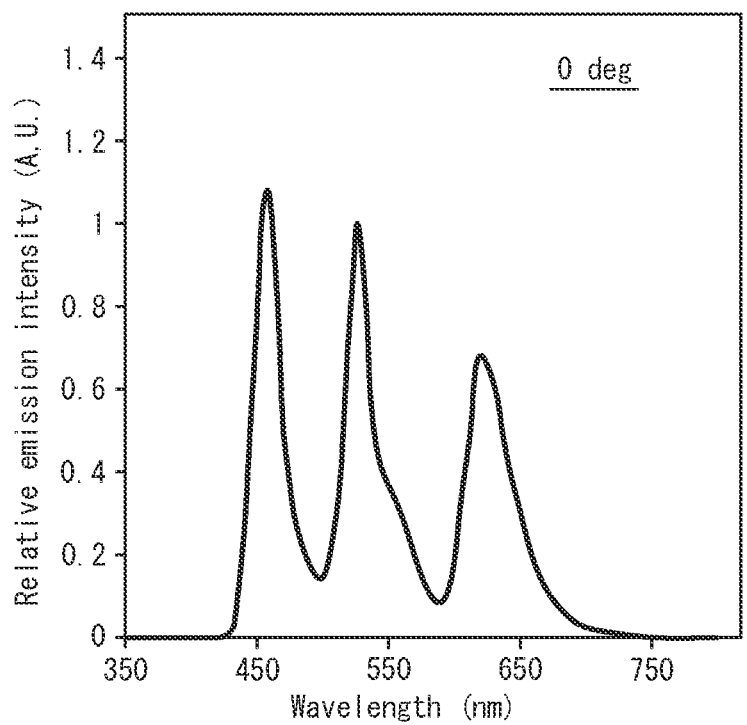
FIG. 1A is a schematic view of the emission spectrum of when independently controlled RGB emission active matrix OLEDs are viewed from the front.
Figure 1B:
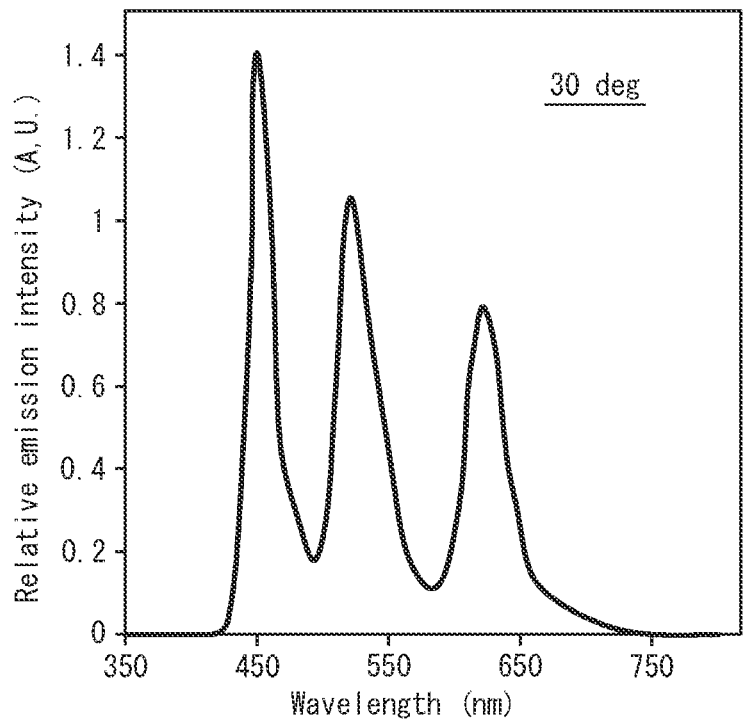
FIG. 1B is a schematic view of the emission spectrum of when independently controlled RGB emission active matrix OLEDs are viewed at an oblique angle of 30°.

Optical filters and light-emitting devices of the present disclosure will now be described in detail based on embodiments.

(Optical Filter)

In terms of structure, an optical filter according to an embodiment of this disclosure (hereinafter, may be referred to as "optical filter of this embodiment"), includes a transmission portion transmitting light and an absorption portion absorbing light between a plane of light incidence and a plane of light emission. The transmission portion and the absorption portion may be continuous or discontinuous in the horizontal direction; in the latter case, transmission portions may be collectively referred to as "transmission portion", and absorption portions may be collectively referred to as "absorption portion". Further, in terms of characteristics, for the optical filter of this embodiment, when the transmission spectrum $S_0$ of light incident at an incidence angle of 0° and the transmission spectrum $S_{60}$ of light incident at an incidence angle of 60° are superimposed, the transmittance (%) at an incidence angle of 60° is lower than the transmittance (%) at an incidence angle of 0° by 15% or more for a first wavelength band, and the difference between the transmittance (%) at an incidence angle of 60° and the transmittance (%) at an incidence angle of 0° is 10% or less for a second wavelength band.

The term "transmitting light" herein indicates that the ratio of light transmitted is higher than the ratio of light reflected and the ratio of light absorbed. Further, the term "absorbing light" herein indicates that the light absorbing characteristics depends on the wavelength, specifically, the absorptance varies depending on the wavelength of light.

The transmission portion in the optical filter of this embodiment may be formed, for example, using a UV curable resin. The UV curable resin is not limited, and examples include a UV curable acrylic resin and a UV curable epoxy resin. Such a UV curable resin may be used alone or in combination with another or others.

The absorption portion in the optical filter of this embodiment may be formed, for example, using a UV curable resin and a light absorber. The UV curable resin may be used alone or in combination with another or others. The light absorber may be used alone or in combination with another or others. Note that the resin forming the absorption portion and the resin forming the transmission portion may be the same or different.

Further, in terms of ease of production and availability of materials, preferably in the optical filter of this embodiment, the transmission portion contains a UV curable resin, and the absorption portion contains a UV curable resin and a light absorber absorbing light.

The absorption portion in the optical filter of this embodiment preferably has the maximum absorption wavelength in a wavelength range of visible light (within a range of 380 nm to 780 nm). In this case, the angular dependence of the emission intensity with respect to a given light source can be reduced. The maximum absorption wavelength of the absorption portion can be adjusted, for example, by appropriately selecting the kind of the light absorber used to form the absorption portion.

Examples of the light absorber include dyes. Further, the kind of the light absorber can be appropriately selected based on the wavelength regions for which color correction effects depending on the ancle of incident light are desirably obtained. For example, for an optical filter for a light-emitting device including independently controlled RGB emission active matrix OLEDs or the like as a light source, in order to obtain the color correction effect for blue depending on the angle of incident light, a light absorber having the maximum absorption wavelength in a wavelength region of blue (approximately 435 nm to 480 nm) is preferably used.

The amount of the light absorber contained in the absorption portion can be selected depending on use, and may be for example, but not limited to, 0.5% by mass or more and 4% by mass or less. In particular, in terms of more appropriately reducing the angular dependence of the emission intensity with respect to a light source such as active matrix OLEDs, the amount of the light absorber contained in the absorption portion is preferably 1.0% by mass or more, more preferably 1.2% by mass or more, meanwhile preferably 3% by mass or less, more preferably 2.5% by mass or less.

In the optical filter of this embodiment, the volume of the transmission portion is required to be larger than the volume of the absorption portion. When the volume of the transmission portion is equal to or smaller than the volume of the absorption portion, the angular dependence of the emission intensity with respect to a given light source would not be sufficiently reduced, or the transmittance for light of a specific wavelength region would be excessively reduced, resulting in undesirable change in the color of light passing through the filter.

Further, in terms of production and of further ensuring desired effects, in the optical filter of this embodiment, the transmission portion and the absorption portion have a regular pattern. Further, in terms of production and of further ensuring the desired effect, in the optical filter of this embodiment, the absorption portion is preferably not exposed in the plane of incidence.

As describe above, in terms of structure, the specific aspects of the optical filter of this embodiment are not limited as long as the filter includes a transmission portion and an absorption portion, the volume of the transmission portion is larger than the volume of the absorption portion, and the predetermined requirements for the characteristics to be described are met.

Figure 2A:
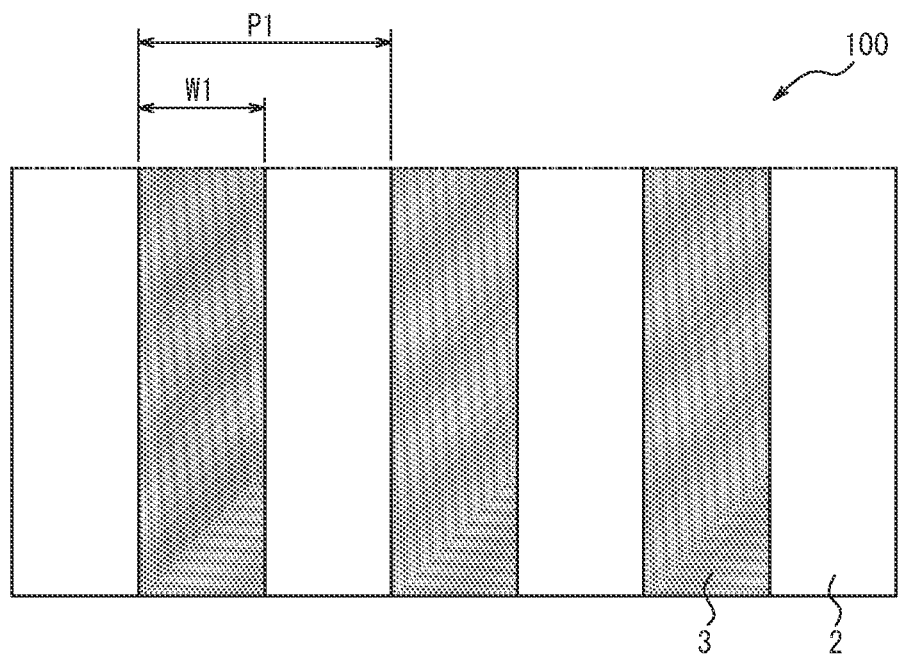
FIG. 2A is a schematic plan view of a part of an optical filter according to an embodiment of this disclosure.
Figure 2B:
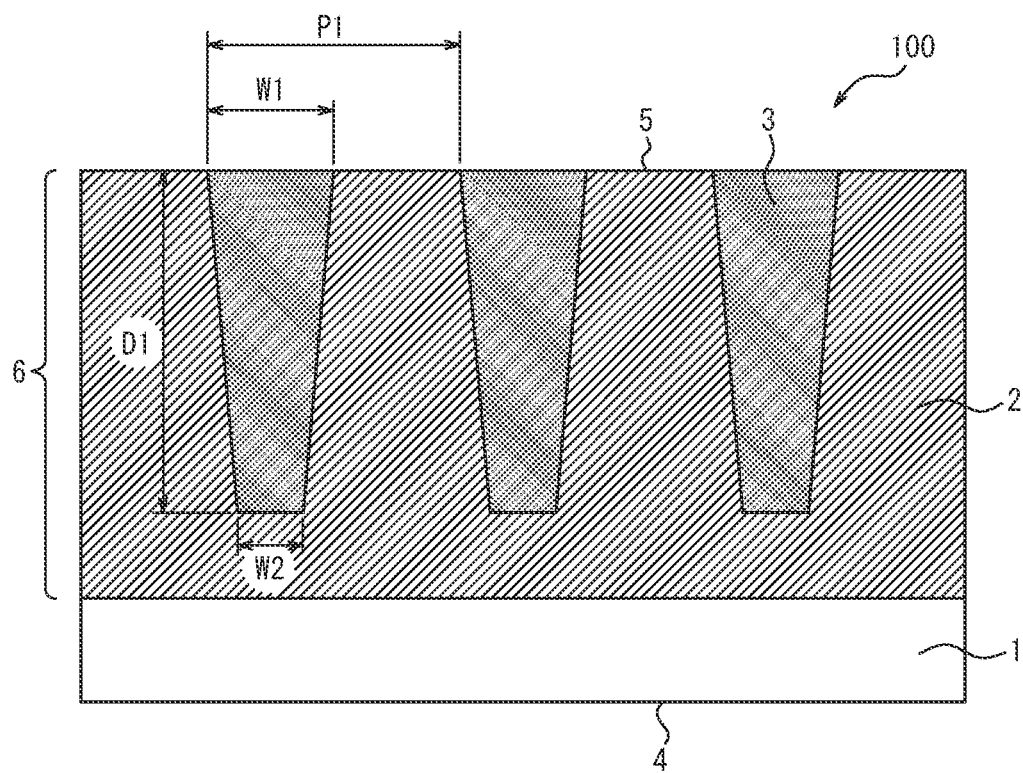
FIG. 2B is a schematic plan view of a part of the optical filter according to the embodiment of this disclosure.

An example of the structure of the optical filter of this embodiment will now be described. FIG. 2A is a schematic plan view of a part of an optical filter according to a first embodiment of this disclosure, and FIG. 2B is a schematic cross-sectional view of a part of the optical filter. In the optical filter 100 illustrated in FIG. 2A and FIG. 2B, a color correction layer 6 including transmission portions 2 and absorption portions 3 is provided on a substrate 1, one of the interfaces of the color correction layer 6 in which the absorption portions 3 are not exposed is a plane of incidence 4, and the other interface of the color correction layer 6 in which the absorption portions 3 are exposed is a plane of emission 5. Specifically, the optical filter 100 is used in a light-emitting device or the like in such a manner that the plane of incidence 4 faces the light source side and the plane of emission 5 faces the viewer side. For such an optical filter, the optical path length of incident light passing through the absorption portions is larger when the angle of the incident angle is larger; thus, the level of the color correction effect for a specific wavelength region can be changed depending on the angle of the incident light.

In FIG. 2B, one of the interfaces of the color correction layer 6 in which the absorption portions 3 are not exposed is the plane of incidence 4, and the other interface of the color correction layer 6 in which the absorption portions 3 are exposed is the plane of emission 5; however, the optical filter of this embodiment is not limited to this. Alternatively, one of the interfaces of the color correction layer 6 in which the absorption portions 3 are exposed may be the plane of incidence 4, and the other interface of the color correction layer 6 in which the absorption portions 3 are not exposed may be the plane of emission 5.

Further, the optical filter depicted in FIG. 2B includes only one substrate; however, the optical filter of this embodiment is not limited to this. Alternatively, the color correction layer 6 including the transmission portion 2 and the absorption portion 3 may be sandwiched between two substrates. Yet alternatively, the optical filter of this embodiment may include no substrate and may have a structure including the transmission portion, the absorption portion, and a film such as an adhesive film.

The optical filter of the first embodiment preferably has a structure in which a plurality of grooves are provided to form a stripe pattern in the transmission portion 2 and the plurality of grooves are stopped with the absorption portions 3 so that the plurality of grooves are filled up as illustrated in FIG. 2A and FIG. 2B. With such a structure, an optical filter that includes a transmission portion and absorption portions having a smaller total volume than the transmission portion and has predetermined characteristics to be described below can be produced more easily.

Examples of the shape of a cross section of each of the plurality of grooves formed in the transmission portion 2 (that is, a cross section of each absorption portion) include, for example, circular, elliptical, polygonal, and triangular shapes. Note however that in terms of ease of production, as illustrated in FIG. 2B, in the optical filter of the first embodiment, a cross section of each of the plurality of grooves formed in the transmission portion 2 (that is, a cross section of each absorption portion) preferably has a polygonal shape, more preferably a quadrangular shape, yet more preferably a trapezoidal shape. Further, the plurality of grooves formed in the transmission portion 2 preferably has a pitch P1 of 3 μm to 500 μm. A pitch P1 within the above range more effectively reduces the angular dependence of the emission intensity with respect to a given light source and inhibits an excessive reduction in the transmittance for the light of a specific wavelength region, thus the desired color of light passing through the filter can be preserved.

Further, the plurality of grooves formed in the transmission portion 2 preferably has a depth D1 of 2 μm to 1000 μm. A depth D1 within the above range more effectively reduces the angular dependence of the emission intensity with respect to a given light source.

Further, in terms of ease of formation, in the cross section of each groove formed in the transmission portion 2, the upper side length W1 on the filter surface side is preferably larger than the lower side length W2 on the bottom side, W1 is preferably 1 μm to 100 μm, and W2 is preferably 0.5 μm to 200 μm. Alternatively, the upper side length W1 on the filter surface side may be equal to or smaller than the lower side length W2 on the bottom side, in which case W1 may be 0.5 μm to 200 μm, and W2 may be 1 μm to 100 μm.

Figure 2C:
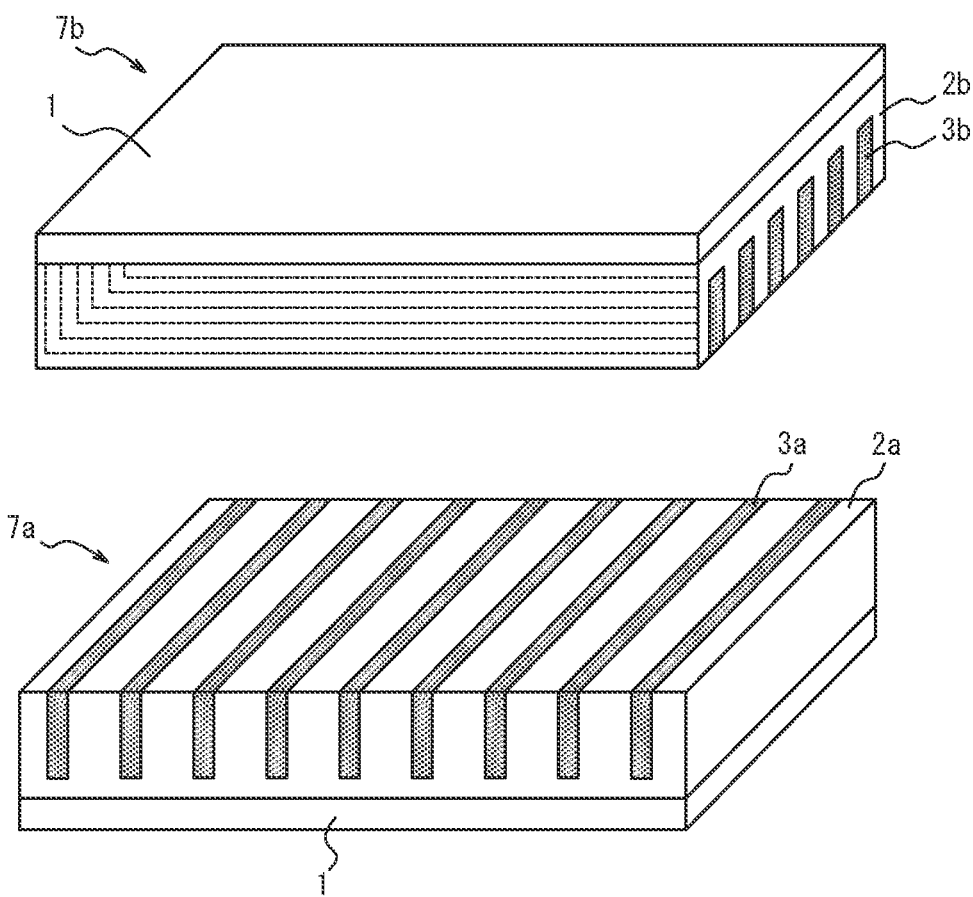
FIG. 2C includes schematic exploded views of a part of an optical filter according to another embodiment of this disclosure.
Figure 2D:
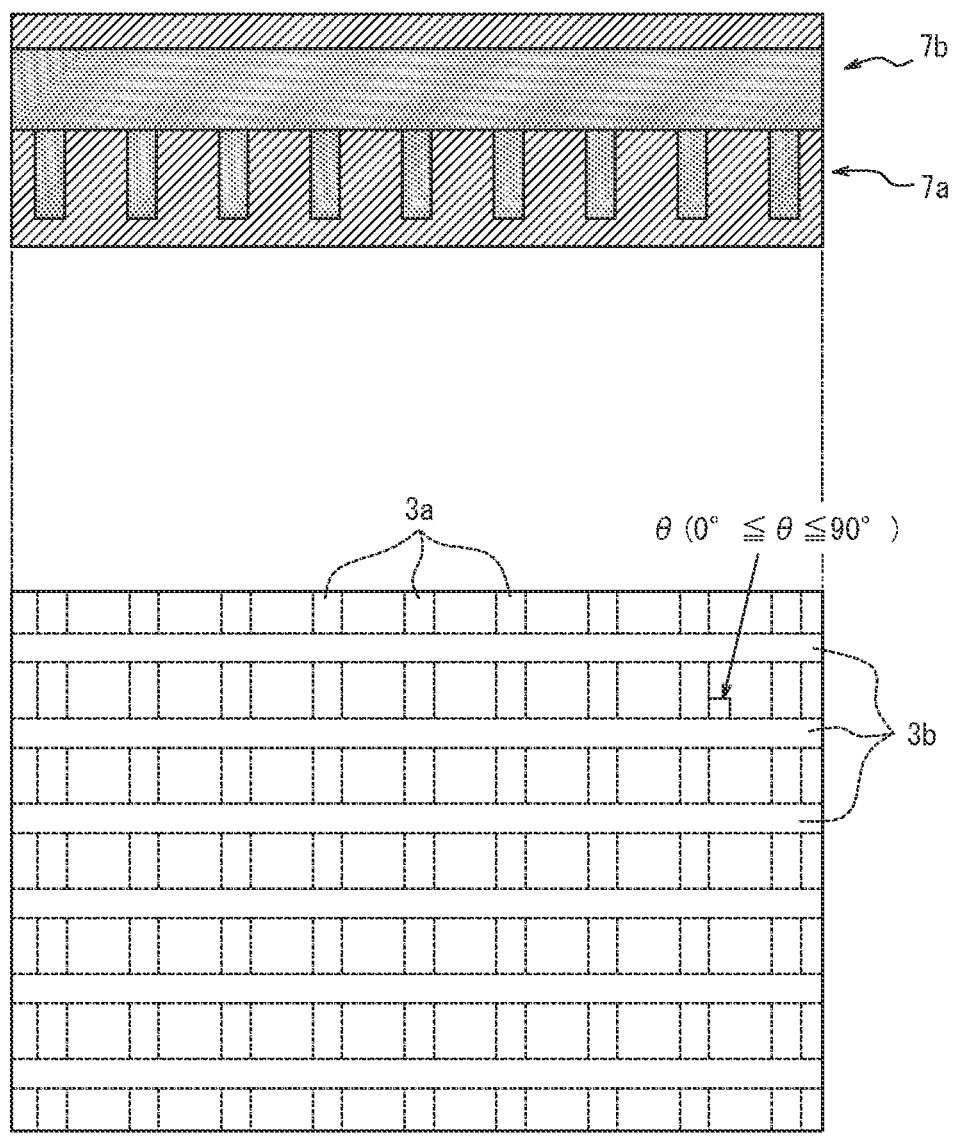
FIG. 2D includes a cross-sectional view and a schematic plan view of a part of the optical filter according to the another embodiment of this disclosure.

Next, an example of the structure of an optical filter of a second embodiment will be described. The optical filter of the second embodiment has a multilayer structure. Specifically, FIG. 2C is an exploded view of a part of the optical filter of the second embodiment, cut at the interface between a first layer 7a and a second layer 7b to be described below. Further, FIG. 2D includes a schematic cross-sectional view (upper diagram) and a schematic plan view (lower diagram) of a part of the optical filter. Note that the substrate 1 is not illustrated in FIG. 2D. Further, the schematic plan view (lower diagram) in FIG. 2D is a plan view of the part of the optical filter depicted in the schematic cross-sectional view (upper diagram) viewed from above.

The optical filter of the second embodiment includes: a substrate 1; a first layer 7a including a transmission portion 2a and absorption portions 3a; a substrate 1; and a second layer 7b including a transmission portion 2b and absorption portions 3b, in the arrangement illustrated in FIG. 2C. Further, a plurality of grooves are provided to form a stripe pattern in the transmission portions 2a and 2b in the first layer 7a and the second layer 7b, respectively, so that the plurality of grooves are filled up by being stopped with the absorption portions 3a and 3b.

The structures of the first layer 7a and the second layer 7b may be the same as one another or may be the same as the structure of the optical filter described using FIG. 2A and FIG. 2B.

Further, the first layer 7a and the second layer 7b depicted in FIG. 2C includes the substrate 1; however, without limitation to this, the first layer 7a and the second layer 7b in the optical filter of the second embodiment need no include the substrate 1.

In the optical filter of the second embodiment, as illustrated in FIG. 2D, the plurality of grooves in the first layer 7a (rows the absorption portions 3a) and the plurality of grooves in the second layer 7b (rows of the absorption portions 3b) cross in plan view. Such an optical filter can provide color correction effects depending on the incidence angle of light based on one coordinate axis (x-axis) on a plane of incidence and color correction effects depending on the incidence angle of light based on the other coordinate axis (y-axis).

In terms of further ensuring the desired effects, in the optical filter of the second embodiment, as illustrated in FIG. 2C, the surface in which the absorption portions 3a of the first layer 7a are exposed and the surface in which the absorption portions 3b of the second layer 7b are exposed preferably face one other to be in contact with each other. Further, in terms of ease of production and of further ensuring the desired effects, the absorption portions 3a of the first layer 7a and the absorption portions 3b of the second layer 7b may be integrally formed.

The crossing angle θ at which the plurality of grooves in the first layer 7a (rows of the absorption portions 3a) and the plurality of grooves in the second layer 7b (rows of the absorption portions 3b) cross ($0°≤θ≤90°$) is not limited, and is preferably 45° or more, more preferably 60° or more, yet more preferably 90° (approximately perpendicular).

The material of the substrate is preferably, but not limited to, a material that is transparent and hard to break. Examples include polyethylene terephthalate (PET) and triacetylcellulose (TAC). Further, the thickness of the substrate is for example, but not limited to, approximately 25 μm to 200 μm.

Next, the characteristics of the optical filter of this embodiment will be described with reference to FIG. 3. FIG. 3 illustrates the transmission spectrum $S_0$ of light incident on an example optical filter at an incidence angle of 0° and the transmission spectrum $S_{60}$ of light incident thereon at an incidence angle of 60, each for a wavelength range of 400 nm to 750 nm on one coordinate plane of the spectra. In FIG. 3, for a wavelength band of 410 nm to 500 nm, the transmittance at an incidence angle of 60° is lower than the transmittance at an incidence angle of 0° by 15% or more; thus, this wavelength band is recognized as the first wavelength band. Further, in FIG. 3, for a wavelength band of 505 nm to 750 nm, the difference between the transmittance (%) at an incidence angle of 60° and the transmittance (%) at an incidence angle of 0° is 10% or less; thus, this wavelength band is recognized as the second wavelength band. Thus, since the first wavelength band and the second wavelength band are found for the optical filter, for light of the first wavelength band, the level of the color correction effect is higher when the angle of incident light is larger; for light of the other wavelength regions including the second wavelength band, the optical characteristics can be substantially fixed with no dependence on the angle of incident light.

The first wavelength band and the second wavelength band described above can be obtained by combined adjustment, for example, increasing the amount of the light absorber contained in the absorption portions, arranging the transmission portion and the absorption portions so that the optical path length of light passing through the absorption portions is larger when the angle of incident light is larger, etc.

The first wavelength band may include a wavelength band for which the transmittance (%) at an incidence angle of 60° is lower than the transmittance (%) at an incidence angle of 0° by 30% or more.

On the other hand, for the second wavelength band, the difference between the transmittance (%) at an incidence angle of 60° and the transmittance (%) at an incidence angle of 0° is preferably 8% or less, more preferably 7% or less. Alternatively, for most of the second wavelength band (for example, a range of 90% or more of the second wavelength band), the difference between the transmittance (%) at an incidence angle of 60° and the transmittance (%) at an incidence angle of 0° is preferably 8% or less, more preferably 7% or less. In these cases, the optical characteristics for the wavelength band with no dependence on the emission intensity can be made to be more stable.

The characteristics with respect to the second wavelength band as described above may be obtained, for example, by increasing the intervals (pitch) between the plurality of the absorption portions and reducing the volume or width of the absorption portions.

For the transmission spectra of $S_0$, $S_{60}$, etc., the spectra found for a wavelength range of visible light (380 nm to 780 nm) may be used, for example, the spectra found for a range of 400 nm to 750 nm may be used.

Further, there may be one or more first wavelength bands and one or more second wavelength bands. For example, there may be only one first wavelength band and two second wavelength bands.

For the optical filter of this embodiment, the first wavelength band may include at least one of a wavelength region of blue (approximately 435 nm to 480 nm), a wavelength region of green (approximately 500 nm to 560 nm), and a wavelength region of green red (approximately 610 nm to 750 nm). For example, independently controlled RGB emission active matrix OLEDs have characteristics such that the intensity of blue light emission perceived by a viewer from an oblique direction is relatively higher than that from the front. Accordingly, for an optical filter for a light emitting device including a light source such as the active matrix OLEDs, the blue wavelength region is preferably included in the first wavelength band. However, without limitation to this, for the optical filter of this embodiment, the green wavelength region may be included in the first wavelength band, and/or the red wavelength region may be included in the first wavelength band.

Note that the position of the first wavelength band can be adjusted, for example, by appropriately selecting a light absorber in terms of the maximum absorption wavelength and using the light absorber to form the absorption portion.

For the optical filter of this embodiment, at least one of the blue wavelength region, the green wavelength region, and the red wavelength region may be included in the second wavelength band. For example, for the optical filter for which the blue wavelength region is included in the first wavelength band as described above, the green wavelength region and the red wavelength region are preferably included in the second wavelength band. However, without limitation to this, for the optical filter of this embodiment, the red wavelength region may be included in the first wavelength band, and the blue wavelength region and the green wavelength region may be included in the second wavelength band. Further, for the optical filter of this embodiment, the green wavelength region is included in the first wavelength band, and the blue wavelength region and the red wavelength region may be included in the second wavelength bands (i.e., in this case, there are two second wavelength bands).

Further, for the optical filter of this embodiment, when the transmission spectrum $S_{30}$ of light incident at an incidence angle of 30° is superimposed on the transmission spectrum $S_0$ and the transmission spectrum $S_{60}$ described above, the difference between the transmittance (%) at an incidence angle of 30° and the transmittance (%) at an incidence angle of 0° is preferably 5% or less for the first wavelength band. Alternatively, for most of the first wavelength band (for example, a range of 90% or more of the first wavelength band), the difference between the transmittance (%) at an incidence angle of 30° and the transmittance (%) at an incidence angle of 0° is preferably 5% or less. In these cases, requirements such as a requirement that the level of the color correction effect starts to increase when the incidence angle of light is increased to some extent (for example, when the incidence angle is 45° or more) can be met.

The above-described characteristics may be obtained, for example, by increasing the intervals (pitch) between the plurality of absorption portions.

Further, for the first wavelength band for the optical filter of this embodiment, it is preferred that the transmittance preferably reduces gradually with increasing angle of incidence. More specifically, for the optical filter of this embodiment, when the transmission spectrum $S_{15}$ of light incident at an incidence angle of 15° and the transmission spectrum $S_{45}$ of light incident at an incidence angle of 45° are superimposed on the above transmission spectra $S_0$, $S_{30}$, and $S_{60}$, for the first wavelength band, (transmittance (%) at an incidence angle of 0°)≥(transmittance (%) at an incidence angle of 15°)≥(transmittance (%) at an incidence angle of 30°)≥(transmittance (%) at an incidence angle of 45°)≥ (transmittance (%) at an incidence angle of 60°) is preferably satisfied. In this case, requirements such as a requirement that the level of the color correction effect for a specific wavelength region is increased more with increasing incidence angle of light can be met.

The characteristics described above can be obtained by, for example, by arranging the transmission portion and the absorption portion so that the optical path of the light passing through the absorption portion is larger as the angle of incident light is larger as illustrated in FIG. 2B.

<Production of Optical Filter>

The method of producing the optical filter of this embodiment is not limited, and may be appropriately selected depending on the intended use. A first example method for producing an optical filter will now be described in detail with reference to FIG. 4A to FIG. 4E.

The first example method includes: a step of preparing a template having a certain groove structure on its surface (template preparation step); a step of pressure-bonding a resin composition for transmission portion, containing a UV curable resin, to the template (first pressure bonding step); a step of curing the pressure-bonded resin composition for transmission portion by irradiating the resin composition for transmission portion with ultraviolet light (first curing step); a step of removing the resin composition for transmission portion thereby obtaining a transmission portion (removal step); a step of pressure-bonding a resin composition for absorption portion, containing a UV curable resin and a light absorber, to the transmission portion, the resin composition (second pressure bonding step); and a step of curing the pressure-bonded resin composition for absorption portion by irradiating the resin composition for absorption portion with ultraviolet light thereby obtaining an absorption portion (second curing step). This method can produce an optical filter having a structure as illustrated in FIG. 2A and FIG. 2B. Further, this method can easily produce the optical filter of this embodiment with high reproducibility.

The template prepared in the template preparation step may be a roll template in terms of continuously producing the transmission portions. Further, the matrix material of the template may include, for example, a nickel layer in which a groove structure is formed, the nickel layer being provided on the surface of the matrix material in terms of ensuring intensity and corrosion resistance. Further, the groove structure in the surface of the template May be a structure opposite to the groove structure to be formed in the transmission portion. The formation of the groove structure on the template may be performed, for example, by machining using a bit such as a diamond bit. The template surface after the machining is preferably cleaned using a given organic solvent.

Figure 4A:
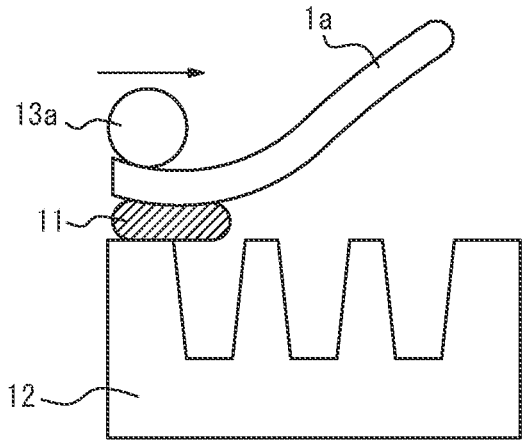
FIG. 4A is a diagram schematically illustrating a first pressure bonding step in an example method for producing an optical filter, according to the embodiment of this disclosure.

After the template preparation step, in the first pressure bonding step, a resin composition for transmission portion 11 containing a UV curable resin is pressure-bonded to the template (FIG. 4A). This first pressure bonding step allows the resin composition for transmission portion 11 to be introduced into the grooves in the template 12. As illustrated in FIG. 4A, the pressure bonding can be performed by a roll to roll process using a pressure bonding apparatus such as a rubber roll laminator 13a. Further, the pressure bonding may be performed over a substrate 1a such as a PET substrate as illustrated in FIG. 4A. The substrate 1a may be a component of the optical filter to be finally produced.

The pressure for the pressure bonding is preferably in a range of 0.1 MPa to 1.0 MPa in terms of sufficiently introducing the resin composition for transmission portion 11 into the grooves in the template 12. Further, in the first pressure bonding step, the amount of the resin composition for transmission portion 11 to be supplied to the template 12 is preferably larger than the volume of the grooves in the template 12 so that a layer of the resin composition for transmission portion 11 is formed to a predetermined thickness on the outermost surface of the template 12 by the pressure bonding.

Additives such as a curing initiator may be added to the resin composition for transmission portion 11 according to need. Further, in terms of increasing peelability and shape preserving property, monomers such as ethylene oxide-based (EO-based) acrylic monomers, propylene oxide-based (PO-based) acrylic monomers, or fluorene-based monomers may be added to the resin composition for transmission portion 11.

Figure 4B:
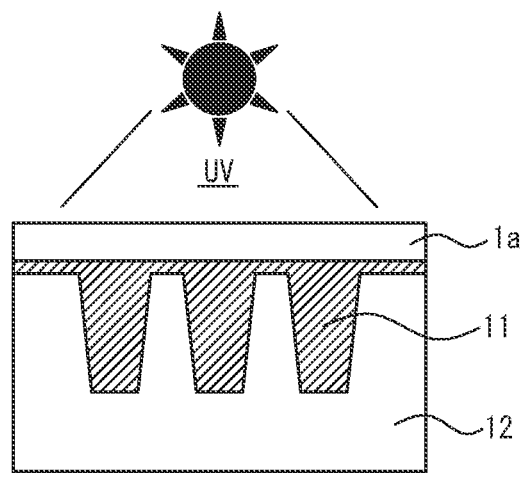
FIG. 4B is a diagram schematically illustrating a first curing step in the example method for producing an optical filter, according to the embodiment of this disclosure.

After the first pressure bonding step, in the first curing step, the above pressure-bonded resin composition for transmission portion 11 is irradiated with ultraviolet light thereby curing the resin composition for transmission portion 11 (FIG. 4B). The curing is preferably performed with the pressure applied in the first pressure bonding step being maintained. The irradiation with the ultraviolet light may be set to approximately 2000 mJ/m$^2$ to 4000 mJ/m$^2$.

Figure 4C:
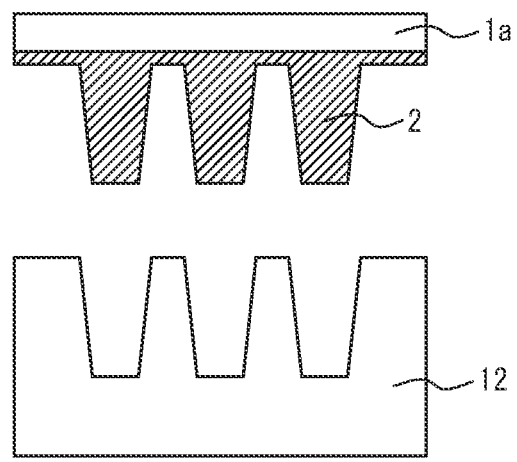
FIG. 4C is a diagram schematically illustrating a removal step in the example method for producing an optical filter, according to the embodiment of this disclosure.

After the first curing step, in the removal step, the cured resin composition for transmission portion 11 is removed from the above template 12 (FIG. 4C). In this removal step, the transmission portion 2 formed on the substrate 1a can be obtained as a component of the optical filter of this embodiment. In the removal from the template 12, care should be taken not to contaminate and damage the transmission portion 2.

Figure 4D:
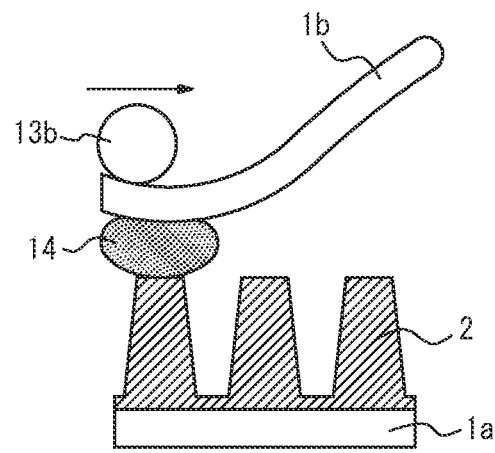
FIG. 4D is a diagram schematically illustrating a second pressure bonding step in an example method for producing an optical filter, according to the embodiment of this disclosure.

After the removal step, in the second pressure bonding step, a resin composition for absorption portion 14 containing a UV curable resin and a light absorber is pressure-bonded to the above transmission portion 2 (FIG. 4D). This second pressure bonding step allows the resin composition for absorption portion 14 to be introduced into the grooves in the transmission portion 2. As illustrated in FIG. 4D, the pressure bonding can be performed by a roll to roll process using a pressure bonding apparatus such as a rubber roll laminator 13b. Further, the pressure bonding may be performed over a substrate 1b such as a PET substrate as illustrated in FIG. 4D. The substrate 1b may be a component of the optical filter to be finally produced.

The pressure for the pressure bonding is preferably in a range of 0.1 MPa to 1.0 MPa in terms of sufficiently introducing the resin composition for absorption portion 14 into the grooves in the transmission portion 2.

Additives such as a curing initiator may be added to the resin composition for absorption portion 14 according to need. Further, in terms of increasing peelability and shape preserving property, monomers such as ethylene oxide-based (EO-based) acrylic monomers, propylene oxide-based (PO-based) acrylic monomers, or fluorene-based monomers may be added to the resin composition for absorption portion 14. Moreover, tetrahydrofurfuryl acrylate (THFA), hexadimethyl diacrylate (HDDA), etc. may be added to the resin composition for absorption portion 14 in order to increase the solubility of the light absorber. The light absorber has been described above.

Figure 4E:
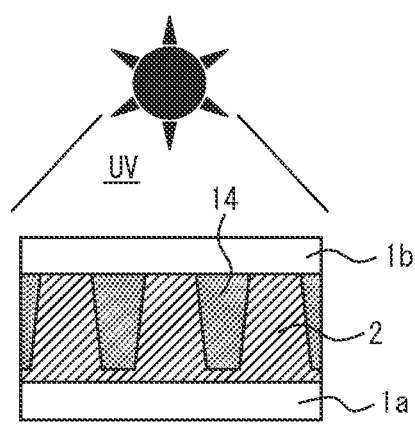
FIG. 4E is a diagram schematically illustrating a second curing step in the example method for producing an optical filter, according to the embodiment of this disclosure.

After the second pressure bonding step, in the second curing step, the above pressure-bonded resin composition for absorption portion 14 is irradiated with ultraviolet light thereby curing the resin composition for absorption portion 14 (FIG. 4E). The curing is preferably performed with the pressure applied in the second pressure bonding step being maintained. The irradiation with the ultraviolet light may be set to approximately 2000 mJ/m$^2$ to 4000 mJ/m$^2$. The curing of the resin composition for absorption portion 14 forms the absorption portion 3, thus an optical filter is finally obtained.

Next, a second example method for producing an optical filter will be described.

The second example method includes: a step of preparing a template having a certain groove structure on its surface (template preparation step); a step of pressure-bonding a resin composition for transmission portion, containing a UV curable resin, to the template (first pressure bonding step); a step of curing the pressure-bonded resin composition for transmission portion by irradiating the resin composition for transmission portion with ultraviolet light (first curing step); a step of removing the resin composition for transmission portion thereby obtaining a transmission portion (removal step); a step of preparing two transmission portions obtained through steps including the removal step and sandwiching a resin composition for absorption portion, containing a UV curable resin and a light absorber, between the two transmission portions (sandwiching step); and a step of curing the sandwiched resin composition for absorption portion by irradiating the resin composition for absorption portion with ultraviolet light thereby obtaining an absorption portion (third curing step). This method can produce an optical filter having a structure as illustrated in FIG. 2C and FIG. 2D. Further, this method can easily produce the optical filter of this embodiment with high reproducibility.

The template preparation step has been described above. Note however that the template prepared in the template preparation step has a structure opposite to a structure in which a plurality of grooves are formed in a stripe pattern.

The first pressure bonding step, the first curing step, and the removal step have been described above. In the removal step, the transmission portion 2 having the plurality of grooves forming a stripe pattern, formed on the substrate 1a can be obtained as a component of the optical filter of this embodiment. Note that in the second example method, two such transmission portions 2 are prepared.

Figure 4F:
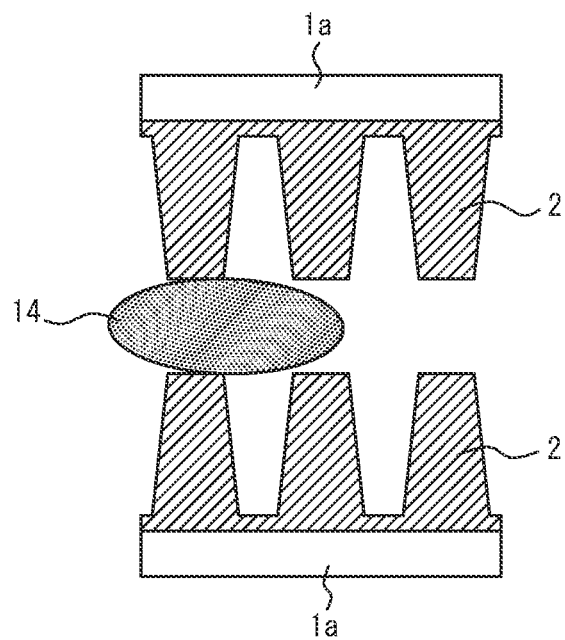
FIG. 4F is a diagram schematically illustrating a sandwiching step in an example method for producing an optical filter, according to the embodiment of this disclosure.

After the removal step, in the sandwiching step, a resin composition for absorption portion 14 containing the ultraviolet curable resin and the light absorber is sandwiched between the two transmission portions 2 having been prepared (FIG. 4F). Here, a surface in which the grooves of one of the transmission portions 2 are formed and a surface in which the grooves of the other transmission portion 2 are formed are placed to face each other. Further, the two transmission portions 2 are placed to face each other so that the plurality of grooves in one of the transmission portions 2 and the plurality of grooves in the other transmission portion 2 cross. This sandwiching step allows the resin composition for absorption portion 14 to be introduced into the grooves in the two transmission portions 2. The pressure for the sandwiching is preferably in a range of 0.1 MPa to 1.0 MPa in terms of sufficiently introducing the resin composition for absorption portion 14 into the grooves in the two transmission portions 2.

The resin composition for absorption portion 14 has been described above.

Figure 4G:
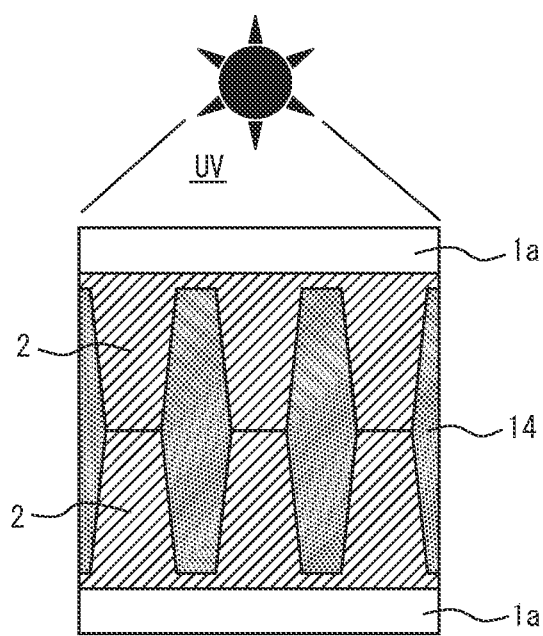
FIG. 4G is a diagram schematically illustrating a third curing step in the example method for producing an optical filter, according to the embodiment of this disclosure.

After the sandwiching step, in the third curing step, the resin composition for absorption portion 14 sandwiched between the two transmission portions 2 is irradiated with ultraviolet light thereby curing the resin composition for absorption portion 14 (FIG. 4G). The irradiation with the ultraviolet light may be set to approximately 2000 mJ/m$^2$ to 4000 mJ/m$^2$ The curing of the resin composition for absorption portion 14 forms the absorption portion 3, thus an optical filter is finally obtained. In the obtained optical filter, the absorption portion in one of the transmission portions and the absorption portion in the other transmission portion are integrally formed.

(Light-Emitting Device)

A light-emitting device according to an embodiment of this disclosure (hereinafter, may be referred to as "light-emitting device of this embodiment") characteristically includes a light source and the optical filter described above. Since the light-emitting device of this embodiment includes the above-described optical filter, the light source has reduced angular dependence of the emission intensity. In the light-emitting device of this embodiment, the above optical filter may be placed so that the plane of incidence faces the light source side and the plane of emission faces the viewer side.

Examples of the light source include, for example, self-emitting LEDs and OLEDs, more specifically, the light source may be an independently controlled RGB emission light source.

The light-emitting device of this embodiment is not limited as long as it includes a light source and the above-described optical filter; the positional relationship between the light source and the optical filter, the components to be included other than the light source and the optical filter may be controlled or selected as appropriate.

EXAMPLES

More detailed description will be given below using examples and comparative examples, although the present disclosure is not limited to these examples.
<Preparation and Evaluation of Optical filter (I)>

Example 1-1

As a template, a roll template in which a certain groove structure was formed by machining a nickel plated layer on its surface using a diamond bit was prepared. A resin composition containing a UV curable acrylic resin (developed by Dexerials Corporation) was pressure-bonded to the template with a PET substrate ("A4300" manufactured by TOYOBO CO., LTD., thickness: 125 μm) therebetween using a rubber roll laminator at a pressure of 0.5 MPa, and was introduced into the grooves in the template. Next, with the pressure maintained, the pressure-bonded resin composition was irradiated with ultraviolet light at 3000 mJ/m$^2$, thereby curing the resin composition. After that, the cured resin composition was removed from the template in such a manner that the resin composition would not for example be contaminated, thereby obtaining a transmission portion in which a plurality of grooves were formed to have a structure opposite to the groove structure of the roll template.

Next, a resin composition containing a UV curable acrylic resin ("UVX-6366" manufactured by TOAGOSEI CO., LTD.) and a dye ("FDB-006" manufactured by YAMADA CHEMICAL CO., LTD, maximum absorption wavelength: 473 nm) was pressure-bonded to a surface of the obtained transmission portion, in which the plurality of grooves were formed, with a PET substrate ("A4300" manufactured by TOYOBO CO., LTD., thickness: 125 μm) therebetween using a rubber roll laminator at a pressure of 0.5 MPa, and was introduced into the grooves in the transmission portion. The content of the dye in the above resin composition of Example 1-1 was 3% by mass. Next, with the pressure maintained, the pressure-bonded resin composition was irradiated with ultraviolet light at 3000 mJ/m$^2$, thereby curing the resin composition; thus, an absorption portion was formed. In this manner, an optical filter was finally obtained.

The obtained optical filter had a structure in which a plurality of grooves each having a trapezoidal cross section were provided to form a stripe pattern in the transmission portion 2 in such a manner that the plurality of grooves were stopped with the absorption portion 3 so that the plurality of grooves were filled up as illustrated in FIG. 2A and FIG. 2B. Further, the volume of the transmission portion in the obtained optical filter was larger than the volume of the absorption portion. Moreover, the maximum absorption wavelength of the absorption portion in the obtained optical filter was the same as the maximum absorption wavelength of the dye used. Further, the plurality of grooves formed in the transmission portion of the obtained optical filter had a pitch P1 of 60 μm, a depth D1 of 100 μm, an upper side length W1 of 30 μm, and a lower side length W2 of 9 μm.

Example 1-2

An optical filter was obtained in the same manner as in Example 1-1 except that the content of the dye in the resin composition for absorption portion was 1.5% by mass in Example 1-2.

Example 1-3

An optical filter was obtained in the same manner as in Example 1-1 except that the dye used for the resin composition for absorption portion was "FDB-304" (manufactured by YAMADA CHEMICAL CO., LTD, maximum absorption wavelength: 650 nm) in Example 1-2 instead of "FDB-006".

Figure 5A:
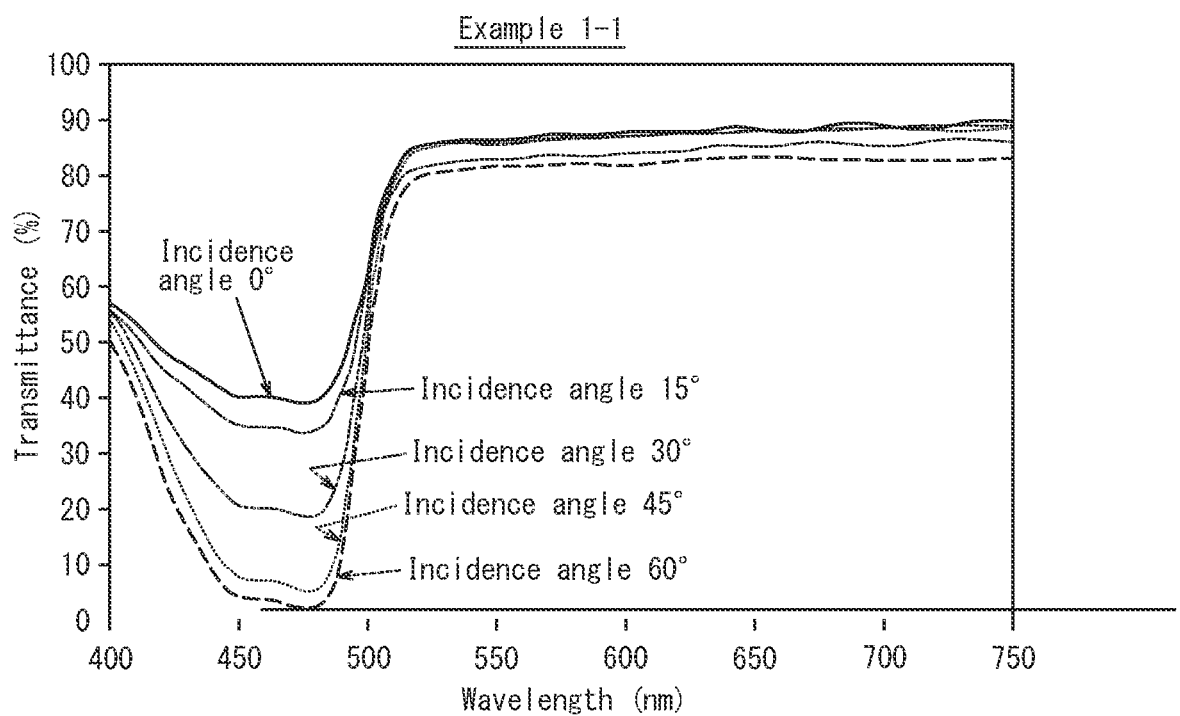
FIG. 5A is a schematic view of the transmission spectrum of light incident at each incidence angle on an optical filter of Example 1-1.
Figure 5B:
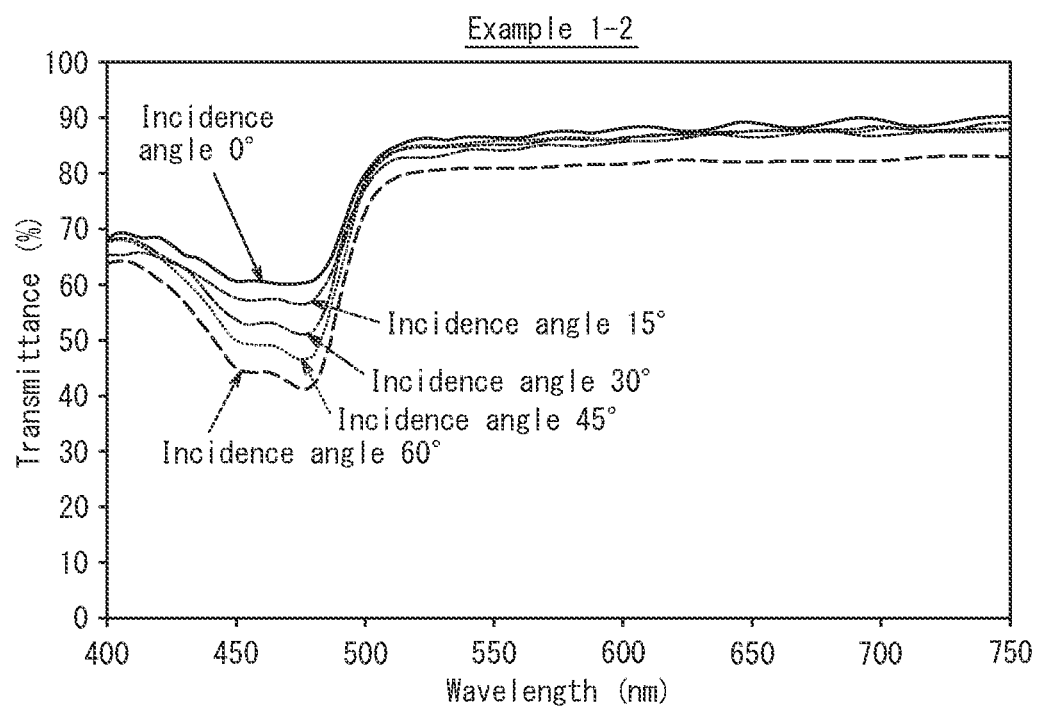
FIG. 5B is a schematic view of the transmission spectrum of light incident at each incidence angle on an optical filter of Example 1-2.
Figure 5C:
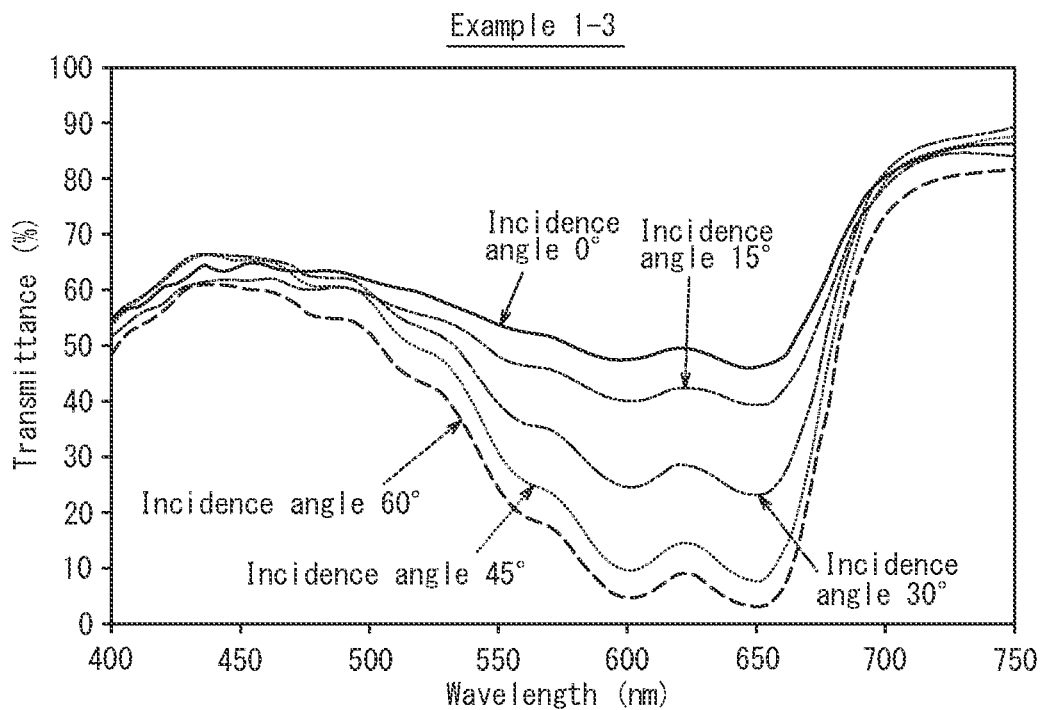
FIG. 5C is a schematic view of the transmission spectrum of light incident at each incidence angle on an optical filter of Example 1-3.

For each of the obtained optical filters, the transmission spectra $S_0$, $S_{15}$, $S_{30}$, $S_{45}$, and $S_{60}$ of light incident at angles of 0°, 15°, 30°, 45°, and 60° were found using a spectrophotometer. For each optical filter, the transmission spectrum of light at each incidence angle (wavelength: 400 nm to 750 nm) is superimposed on one another in the schematic views of FIG. 5A to FIG. 5C.

In the transmission spectrum for the optical filter in Example 1-1, (transmittance at incidence angle of 0°)-(transmittance at incidence angle of 60°) was 15% or more for a wavelength band of 412 nm to 499 nm; thus, the wavelength band was recognized as a first wavelength band. In particular, (transmittance at incidence angle of 0°)-(transmittance at incidence angle of 60°) was 30% or more for a wavelength band of 432 nm to 492 nm. Further, in the transmission spectrum for the optical filter in Example 1-1, the difference between the transmittance at an incidence angle of 60° and the transmittance at an incidence angle of 0° was 10% or less for a wavelength band of 504 nm to 750 nm; thus, the wavelength band was recognized as a second wavelength band.

Moreover, in the transmission spectrum for the optical filter in Example 1-1, the difference between the transmittance at an incidence angle of 60° and the transmittance at an incidence angle of 0° was 8% or less for a wavelength band of 507 nm to 750 nm, and was 7% or less for a wavelength band of 509 nm to 750 nm.

In the transmission spectrum for the optical filter in Example 1-2, (transmittance at incidence angle of 0°)-(transmittance at incidence angle of 60°) was 15% or more for a wavelength band of 448 nm to 486 nm; thus, the wavelength band was recognized as a first wavelength band. Further, in the transmission spectrum for the optical filter in Example 1-2, the difference between the transmittance at an incidence angle of 60° and the transmittance at an incidence angle of 0° was 10% or less for wavelength bands of 400 nm to 432 nm and 494 nm to 750 nm; thus, the wavelength bands were recognized as second wavelength bands.

Moreover, in the transmission spectrum for the optical filter in Example 1-2, the difference between the transmittance at an incidence angle of 60° and the transmittance at an incidence angle of 0° was 8% or less for wavelength bands of 400 nm to 426 nm and 498 nm to 750 nm, and was 7% or less for wavelength bands of 400 nm to 417 nm, 501 nm to 642 nm, 657 nm to 677 nm, and 705 nm to 734 nm.

In the transmission spectrum for the optical filter in Example 1-3, (transmittance at incidence angle of 0°)-(transmittance at incidence angle of 60°) was 15% or more for a wavelength band of 514 nm to 684 nm; thus, the wavelength band was recognized as a first wavelength band. In particular, (transmittance at incidence angle of 0°)-(transmittance at incidence angle of 60°) was 30% or more for a wavelength band of 552 nm to 672 nm. Further, in the transmission spectrum for the optical filter in Example 1-3, the difference between the transmittance at an incidence angle of 60° and the transmittance at an incidence angle of 0° was 10% or less for wavelength bands of 400 nm to 500 nm and 693 nm to 750 nm; thus, the wavelength bands were recognized as second wavelength bands.

Moreover, in the transmission spectrum for the optical filter in Example 1-3, the difference between the transmittance at an incidence angle of 60° and the transmittance at an incidence angle of 0° was 8% or less for wavelength bands of 400 nm to 477 nm and 697 nm to 750 nm, and was 7% or less for wavelength bands of 400 nm to 473 nm and 701 nm to 750 nm.

Comparative Example 1-1

As a conventional multilayer band-pass filter, a filter having a 16-layer structure to be described below was considered.

TABLE 1

| | Substrate | 1st Layer | 2nd Layer | 3rd Layer | 4th Layer | 5th Layer | 6th Layer | 7th Layer | 8th Layer |
|---|---|---|---|---|---|---|---|---|---|
| Material | Glass | $Nb_2O_5$ | $SiO_2$ | $Nb_2O_5$ | $SiO_2$ | $Nb_2O_5$ | $SiO_2$ | $Nb_2O_5$ | $SiO_2$ |
| Thickness (nm) | — | 46.88 | 75.41 | 109.72 | 75.41 | 109.72 | 75.41 | 109.72 | 75.41 |

| | 9th Layer | 10th Layer | 11th Layer | 12th Layer | 13th Layer | 14th Layer | 15th Layer | 16th Layer |
|---|---|---|---|---|---|---|---|---|
| Material | $Nb_2O_5$ | $SiO_2$ | $Nb_2O_5$ | $SiO_2$ | $Nb_2O_5$ | $SiO_2$ | $Nb_2O_5$ | $SiO_2$ |
| Thickness (nm) | 109.72 | 75.41 | 109.72 | 75.41 | 109.72 | 75.41 | 109.72 | 75.41 |

Comparative Example 1-2

As a conventional absorption filter, a filter including an absorption film with a thickness of 1000 nm on a glass substrate was considered. The absorption film had an extinction coefficient k of 0.01 for a wavelength region of 400 nm to 475 nm, an extinction coefficient k of 0 for a wavelength region of 500 nm to 750 nm, and a refractive index of 1.5 for all wavelengths.

Figure 5D:
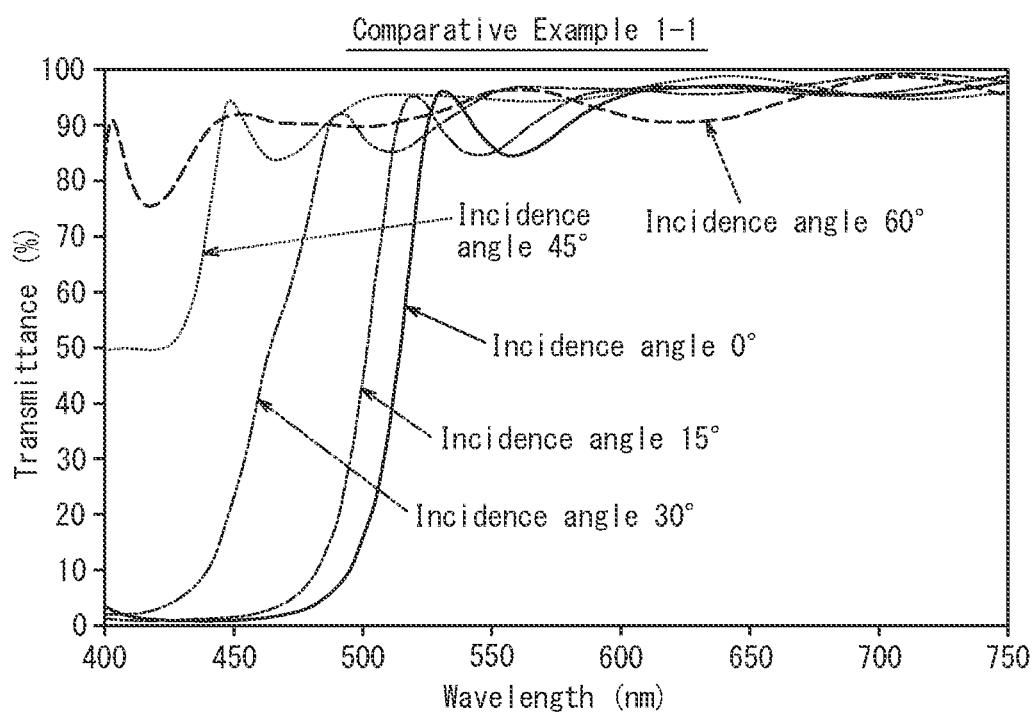
FIG. 5D is a schematic view of the transmission spectrum of light incident at each incidence angle on an optical filter of Comparative Example 1-1.
Figure 5E:
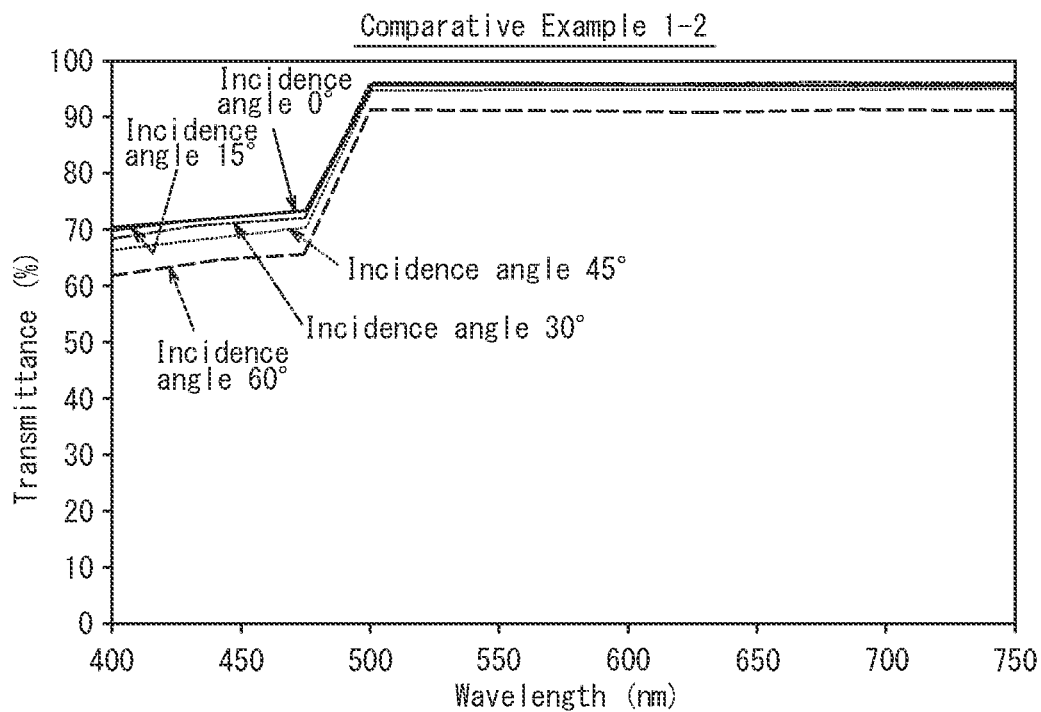
FIG. 5E is a schematic view of the transmission spectrum of light incident at each incidence angle on an optical filter of Comparative Example 1-2.

For each of the optical filters, the transmission spectra $S_0$, $S_{15}$, $S_{30}$, $S_{45}$, and $S_{60}$ of light incident at angles of 0°, 15°, 30°, 45°, and 60° were found using calculation software "TFCalc" (available from HULINKS Inc.). For each optical filter, the transmission spectrum at each incidence angle is superimposed on one another in the schematic views of FIG. 5D to FIG. 5E.

Comparative Example 1-3

Figure 5F:
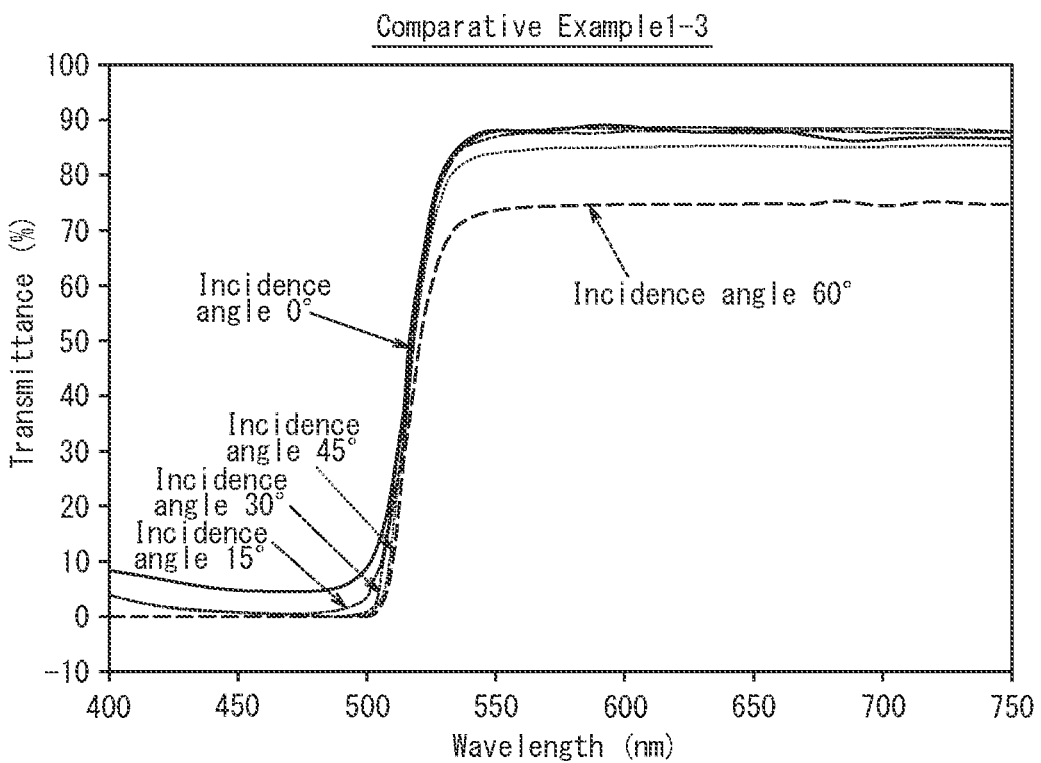
FIG. 5F is a schematic view of the transmission spectrum of light incident at each incidence angle on an optical filter of Comparative Example 1-3.

An optical filter was obtained in the same manner as in Example 1-1 except that the composition of the resin composition for absorption portion and the resin composition for transmission portion was switched, namely, a plurality of grooves were formed in the absorption portion and the plurality of grooves were stopped with the transmission portion so that the plurality of grooves were filled up. As in Example 1-1, the transmission spectra $S_0$, $S_{15}$, $S_{30}$, $S_{45}$, and $S_{60}$ were found. The transmission spectrum at each incidence angle is superimposed on one another in the schematic view of FIG. 5F.

In the transmission spectra for the optical filter of Comparative Example 1-1, the transmittance at an incidence angle of 60° was lower than the transmittance at an incidence angle of 0° by 15% or more for no wavelength band. In particular, in the transmission spectra for the optical filter of Comparative Example 1-1, the peak in each transmission spectrum shifted toward the short wavelength side with increasing angle of incident light.

In the transmission spectra for the optical filter of Comparative Example 1-2, the transmittance at an incidence angle of 60° was lower than the transmittance at an incidence angle of 0° by 15% or more for no wavelength band; instead, the difference between the transmission spectrum at an incidence angle of 60° and the transmission spectrum at an incidence angle of 0° was 9% or less for all wavelengths.

In the transmission spectra for the optical filter of Comparative Example 1-3, the transmittance at an incidence angle of 60° was lower than the transmittance at an incidence angle of 0° by 15% or more for no wavelength band; instead, the difference between the transmission spectrum at an incidence angle of 60° and the transmission spectrum at an incidence angle of 0° was less than 15% for all wavelengths.

As described above, in Examples 1-1 to 1-3, optical filters having different color correction effects for specific wavelength regions depending on the angle of incident light were obtained by solving the problems of conventional filters.

<Fabrication and Evaluation of Light-Emitting Device>

Example 2

A light-emitting device was fabricated by preparing independently controlled RGB emission active matrix OLEDs (manufactured by Samsung Electronics Co., Ltd.) as a light source and placing the optical filter of Example 1-2 on top of the light source.

Comparative Example 2

A light-emitting device was fabricated by preparing independently controlled RGB emission active matrix OLEDs (manufactured by Samsung Electronics Co., Ltd.) as a light source and placing the optical filter of Comparative Example 1-1 on top of the light source.

The hue of light from each of the light-emitting devices and the OLEDs alone was measured for the angles at which a viewer viewed. Specifically, the reflectance spectra of light received from the front (0° oblique) and in 10°, 20°, and 30° oblique directions were found using a plasma monitor "C10346-01" manufactured by Hamamatsu Photonics K.K., and the values of Y, x, and y in the Yxy color space; the values of a* and b* in the L*a*b* color space; and the distance from the a*b* center (square root of $(a^{*2}+b^{*2})$) were calculated from the reflectance spectra. The results are given in Table 2. Further, the values of a* and b* are plotted on the a*b* coordinate plane given in FIG. 6A, and the distance from the a*b* center for each angle is plotted in FIG. 6B.

TABLE 2

| OLEDs alone | | | | | |
|---|---|---|---|---|---|
| deg | Y | x | y | a* | b* | Distance from a*b* center |
| 0 | 0.369 | 0.266 | 0.299 | −0.941 | −1.938 | 2.154 |
| 10 | 0.351 | 0.264 | 0.297 | −0.880 | −1.956 | 2.145 |
| 20 | 0.321 | 0.260 | 0.290 | −0.689 | −2.138 | 2.247 |
| 30 | 0.330 | 0.259 | 0.287 | −0.612 | −2.340 | 2.419 |

| Example 2 | | | | | |
|---|---|---|---|---|---|
| deg | Y | x | y | a* | b* | Distance from a*b* center |
| 0 | 0.317 | 0.287 | 0.343 | −1.465 | 0.036 | 1.466 |
| 10 | 0.293 | 0.286 | 0.342 | −1.365 | 0.000 | 1.365 |
| 20 | 0.271 | 0.285 | 0.344 | −1.350 | 0.030 | 1.350 |
| 30 | 0.278 | 0.287 | 0.349 | −1.447 | 0.187 | 1.459 |

| Comparative Example 2 | | | | | |
|---|---|---|---|---|---|
| deg | Y | x | y | a* | b* | Distance from a*b* center |
| 0 | 0.304 | 0.382 | 0.497 | −2.266 | 3.678 | 4.320 |
| 10 | 0.301 | 0.367 | 0.496 | −2.586 | 3.501 | 4.353 |
| 20 | 0.292 | 0.305 | 0.388 | −1.971 | 1.251 | 2.335 |
| 30 | 0.317 | 0.265 | 0.302 | −0.937 | −1.578 | 1.835 |

Figure 6A:
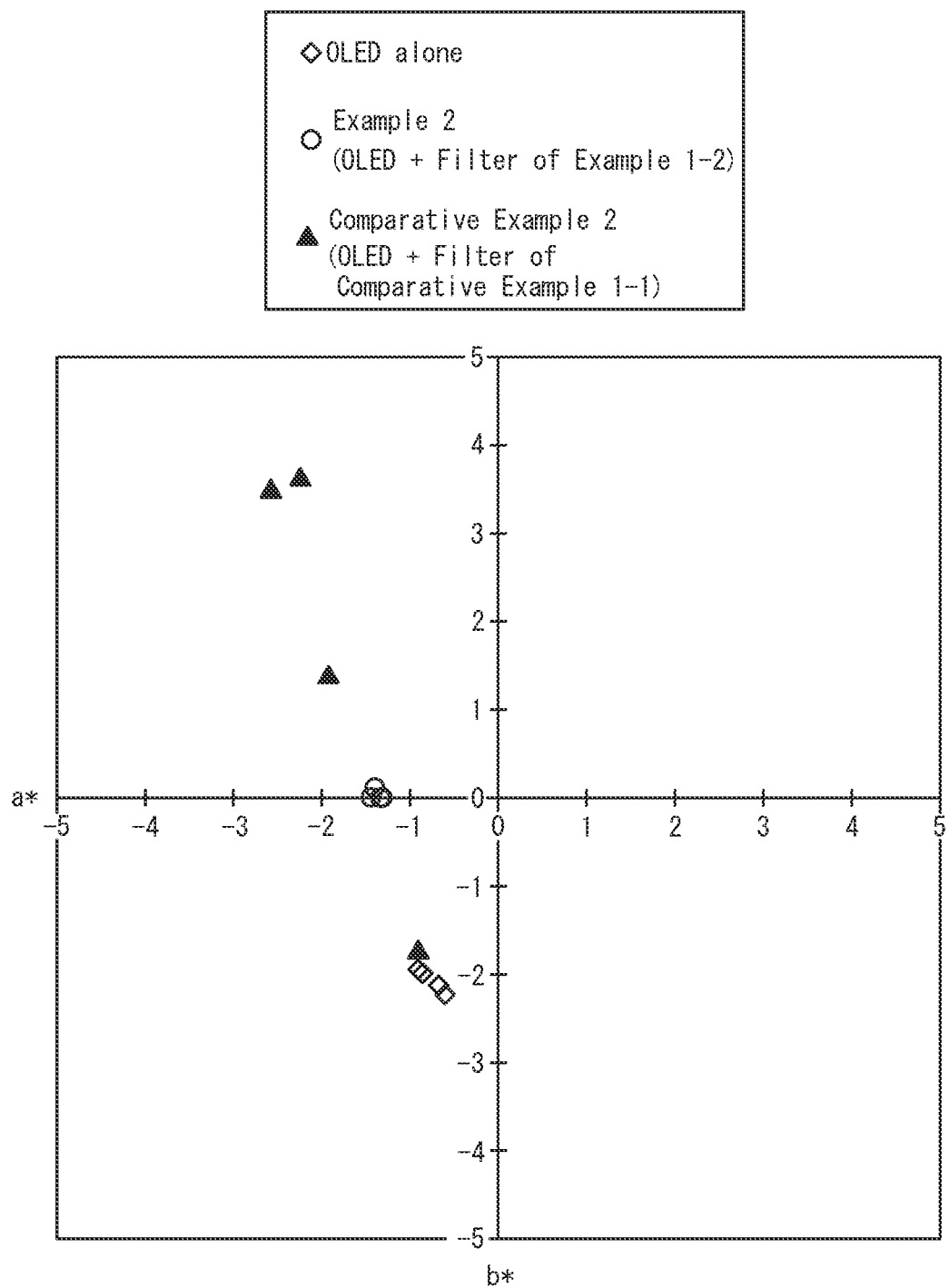
FIG. 6A is a diagram in which the values of a* and b* for light from light-emitting devices of an example and a comparative example, and from OLEDs alone are plotted on the a*b* coordinate plane.

First, for the OLEDs alone, the angular dependence of the emission intensity was confirmed from Table 2 and FIG. 6A for example because b* increased with increasing angle at which the viewer viewed.

Figure 6B:
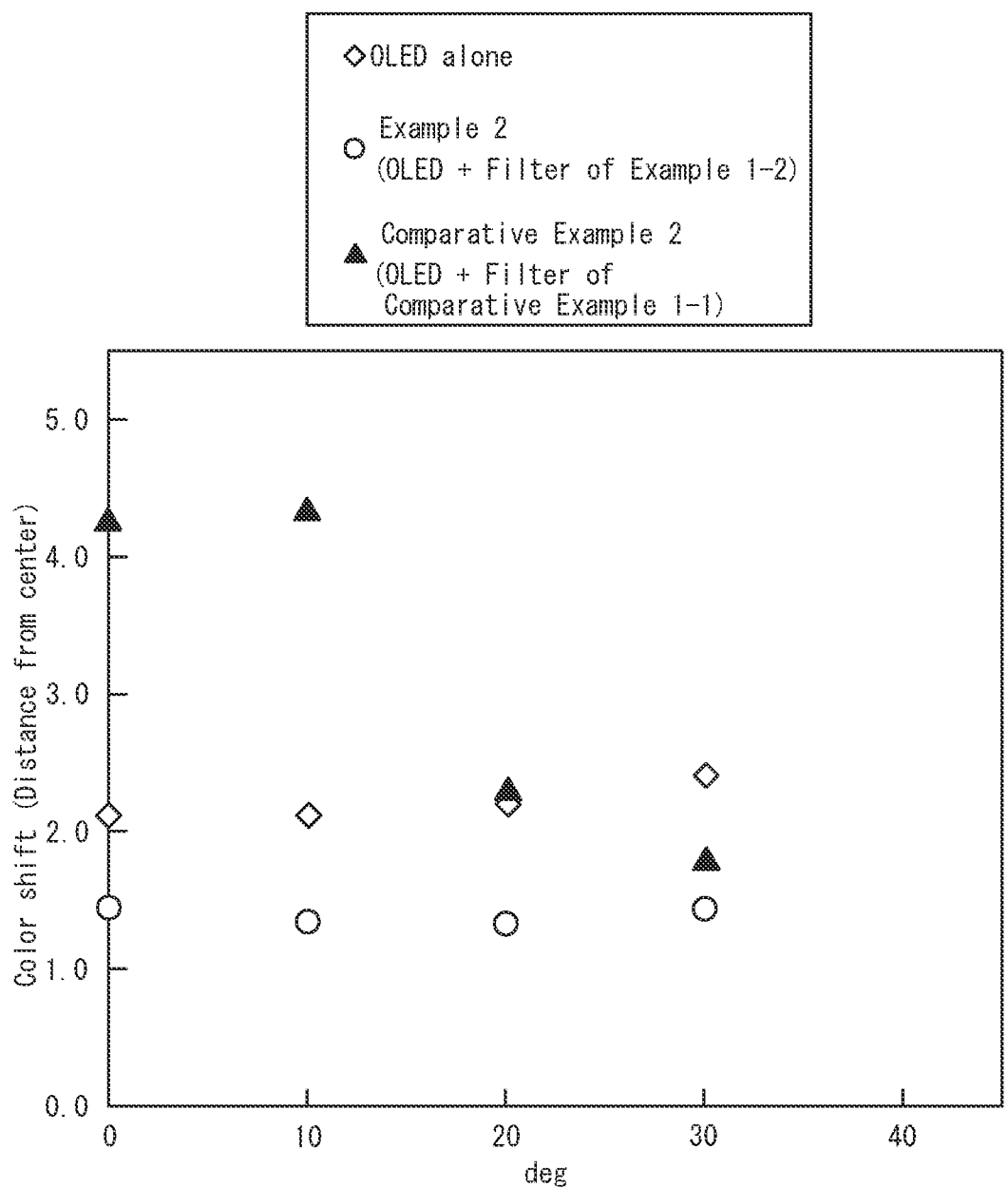
FIG. 6B is a diagram in which the distances of a* and b* from the center for light from light-emitting devices of an example and a comparative example, and from OLEDs alone are plotted for each angle of the viewer's view.
Figure 7A:
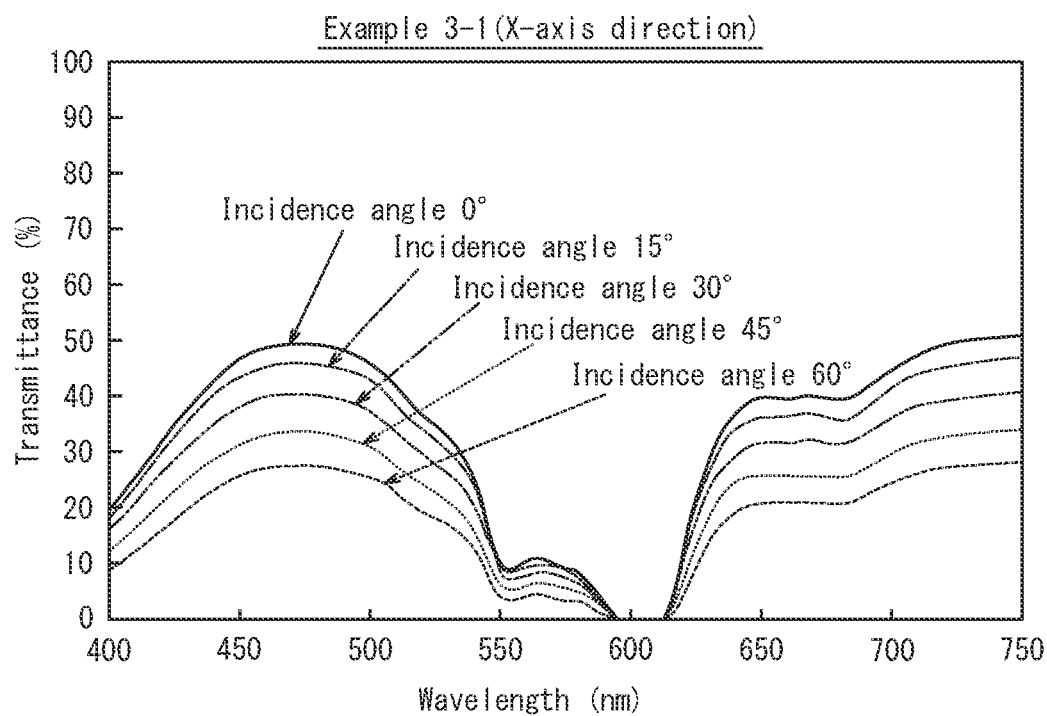
FIG. 7A is a schematic view of the transmission spectrum of light at each incidence angle on an optical filter of Example 3-1 with reference to the x-axis.
Figure 7B:
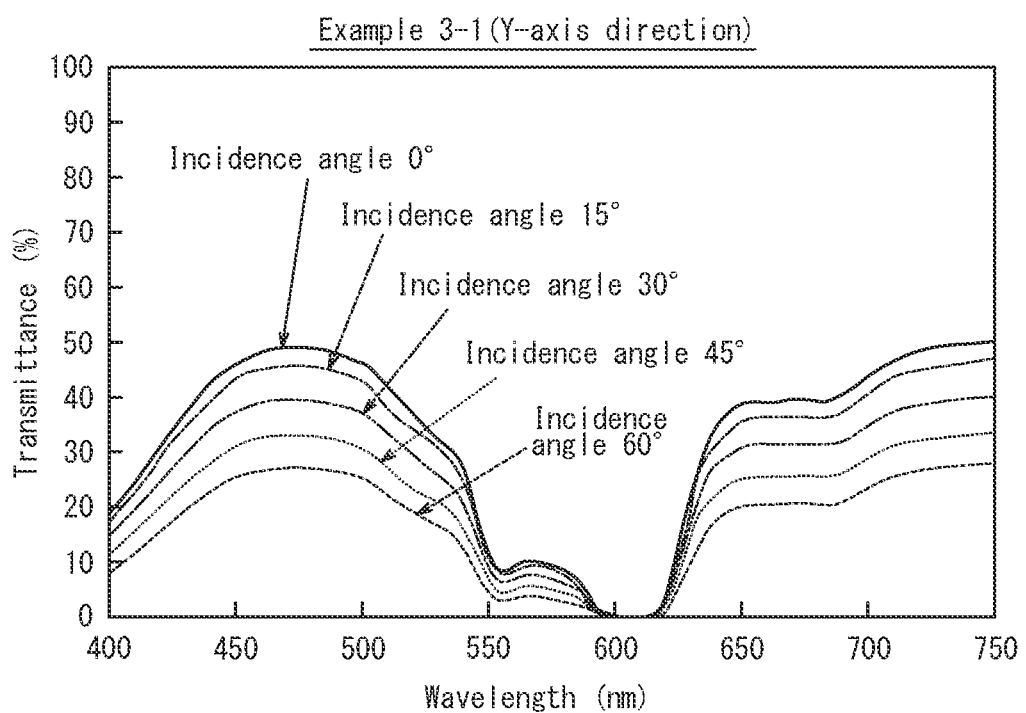
FIG. 7B is a schematic view of the transmission spectrum of light at each incidence angle on the optical filter of Example 3-1 with reference to the y-axis.
Figure 7C:
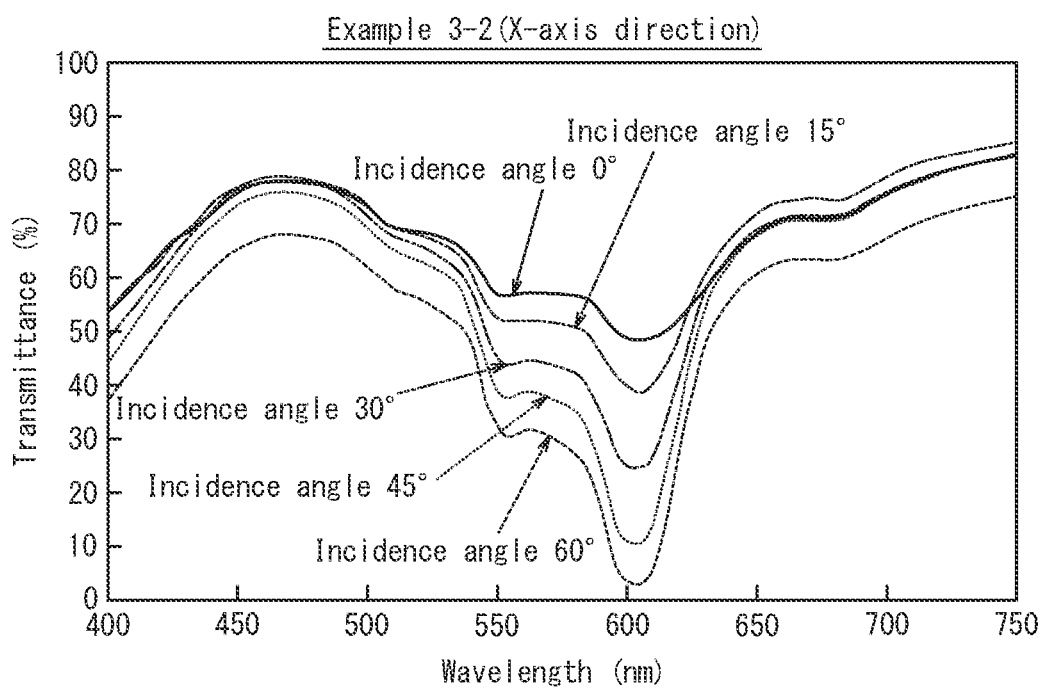
FIG. 7C is a schematic view of the transmission spectrum of light at each incidence angle on an optical filter of Example 3-2 with reference to the x-axis.
Figure 7D:
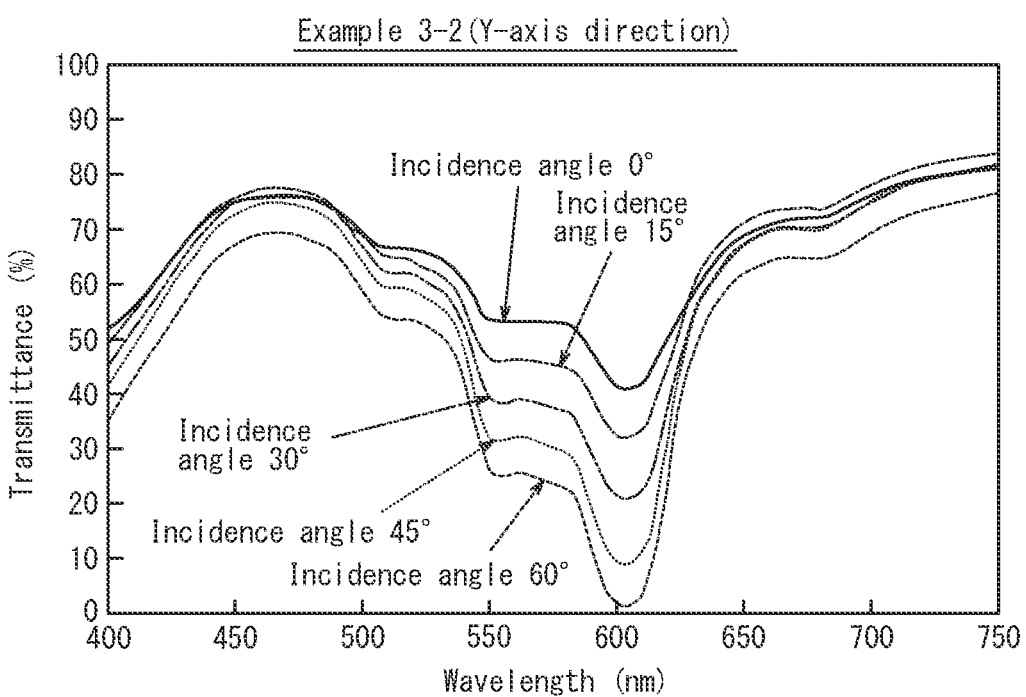
FIG. 7D is a schematic view of the transmission spectrum of light at each incidence angle on the optical filter of Example 3-2 with reference to the y-axis.

On the other hand, for the light-emitting device of Example 2, it was confirmed from Table 2, FIG. 6A, and FIG. 6B that the values of a* and b* were substantially fixed regardless of the angle at which the viewer viewed, and the angular dependence of the emission intensity for the light source was reduced.

By contrast, for the light-emitting device of Comparative Example 2, the angular dependence of the emission intensity with respect to the light source was not reduced; instead, the hue was found to have greatly varied depending on the angles at which the viewer viewed.

<Fabrication and Evaluation of Optical filter (II)>

Example 3-1

As a template, a roll template in which a certain grid-like groove structure was formed by machining a nickel plated layer on its surface using a diamond bit was prepared. A resin composition containing a UV curable acrylic resin ("UVX-6366" manufactured by TOAGOSEI CO., LTD.) and a dye ("FDB-006" manufactured by YAMADA CHEMICAL CO., LTD, maximum absorption wavelength: 473 nm) was pressure-bonded to the template with a PET substrate ("A4300" manufactured by TOYOBO CO., LTD., thickness: 125 μm) therebetween, and was introduced into the grooves in the template. The content of the dye in the above resin composition of Example 3-1 was 3% by mass. Next, with the pressure maintained, the pressure-bonded resin composition was irradiated with ultraviolet light at 3000 mJ/m$^2$, thereby curing the resin composition. After that, the cured resin composition was removed from the template in such a manner that the resin composition would not for example be contaminated, thereby obtaining an absorption portion formed in a grid pattern (crossing angle θ: 90°) on the substrate.

Next, a resin composition containing a UV curable acrylic resin (developed by Dexerials Corporation) was pressure-bonded, using a plate-like mold, to the surface of the substrate in which the absorption portion was formed, and was introduced into the openings in the grid-like absorption portion. Next, with the pressure maintained, the pressure-bonded resin composition was irradiated with ultraviolet light at 3000 mJ/m$^2$, thereby curing the resin composition; thus, a transmission portion was formed. When the mold was removed, an optical filter including a substrate; an absorption portion formed in a grid pattern on the substrate; and a transmission portion with which the openings in the absorption portion are filled up and the upper part of the absorption portion is covered (single layer structure) was obtained. Note that the absorption portion was not exposed in the surface of the obtained optical filter that was opposite to the substrate side. Further, the volume of the transmission portion in the obtained optical filter was larger than the volume of the absorption portion.

Example 3-2

As in Example 1-1, a transmission portion in which a plurality of grooves were formed (transmission portion before the formation of an absorption portion) was obtained. Two such transmission portions were prepared, and a resin composition containing a UV curable acrylic resin ("UVX-6366" manufactured by TOAGOSEI CO., LTD.) and a dye ("FDB-006" manufactured by YAMADA CHEMICAL CO., LTD, maximum absorption wavelength: 473 nm) was sandwiched between the two transmission portions with a pressure of 0.5 MPa. In this case, the two transmission portions were faced one another so that the plurality of grooves in one of the transmission portions and the plurality of grooves in the other transmission portion were crossed in contact with each other (crossing angle θ: 90°). The content of the dye in the above resin composition of Example 3-2 was 3% by mass. Next, the resin composition sandwiched between the two transmission portions was irradiated with ultraviolet light at 3000 mJ/m$^2$, thereby curing the resin composition; thus, an absorption portion was formed. Thus, an optical filter having a multilayer structure illustrated in FIG. 2C and FIG. 2D was obtained. Further, the volume of the transmission portion in the obtained optical filter was larger than the volume of the absorption portion.

For each of the obtained optical filters, the transmission spectra $S_0$, $S_{15}$, $S_{30}$, $S_{45}$, and $S_{60}$ of light incident at angles of 0°, 15°, 30°, 45°, and 60° with reference to x-axis (axis parallel to the length direction of the grooves in one of the transmission portions) were found using a spectrophotometer. Similarly, the transmission spectra $S_0$, $S_{15}$, $S_{30}$, $S_{45}$, and $S_{60}$ of light incident at angles of 0°, 15°, 30°, 45°, and 60° with reference to y-axis (axis parallel to the length direction of the grooves in the other transmission portion) were found using a spectrophotometer. For each optical filter, the transmission spectrum of light at each incidence angle (wavelength: 400 nm to 750 nm) is superimposed on one another in the schematic views of FIG. 7A, FIG. 7B, FIG. 7C, and FIG. 7D.

FIG. 7A, FIG. 7B, FIG. 7C, and FIG. 7D confirmed that both first wavelength band and second wavelength band were found for both x-axis and y-axis in the transmission spectra for the optical filter of Example 3-1 and Example 3-2. In particular in Example 3-2, since the angular dependence for the target wavelength region was higher, a more favorable color correction effect was obtained. Further, in Example 3-2, the transmittance of light received from the front (incident at an incidence angle of 0°) was higher.

INDUSTRIAL APPLICABILITY

This disclosure provides an optical filter having different color correction effects for specific wavelength regions depending on the angle of incident light, and a light-emitting device that includes the optical filter, with reduced angular dependence of the emission intensity of a light source.

REFERENCE SIGNS LIST

100: Optical filter
1, 1a, 1b: Substrate
2, 2a, 2b: Transmission portion
3, 3a, 3b: Absorption portion
4: Plane of incidence
5: Plane of emission
6: Color correction layer
7a: First layer
7b: Second layer
11: Resin composition for transmission portion
12: Template
13a, 13b: Roll laminator
14: Resin composition for absorption portion

The invention claimed is:

1. An optical filter comprising a transmission portion transmitting light and an absorption portion absorbing light between a plane of incidence and a plane of emission,
   wherein a volume of the transmission portion is larger than a volume of the absorption portion, and
   wherein the optical filter is provided with a first layer including the transmission portion and the absorption portion, and a second layer including the transmission portion and the absorption portion,
   a plurality of grooves are provided to form a stripe pattern in the transmission portion in each of the first layer and the second layer, and the plurality of grooves are stopped with the absorption portion,
   the plurality of grooves in the first layer and the plurality of grooves in the second layer cross in plan view, and
   a surface in which the absorption portions of the first layer are exposed and a surface in which the absorption portions of the second layer are exposed face one other to be in contact with each other, and the absorption portions of the first layer and the absorption portions of the second layer are integrally formed, and
   when a transmission spectrum $S_0$ of light incident at an incidence angle of 0° and a transmission spectrum $S_{60}$ of light incident at an incidence angle of 60° are superimposed, in the optical filter,
   a transmittance (%) at an incidence angle of 60° is lower than a transmittance (%) at an incidence angle of 0° by 15% or more for a first wavelength band, and
   a difference between a transmittance (%) at an incidence angle of 60° and a transmittance (%) at an incidence angle of 0° is 10% or less for a second wavelength band.

2. The optical filter according to claim 1, wherein a maximum absorption wavelength of the absorption portion is within a range of 380 nm to 780 nm.

3. The optical filter according to claim 1, wherein when a transmission spectrum $S_{30}$ for light incident at an incidence angle of 30° is additionally superimposed on the transmission spectrum $S_0$ and the transmission spectrum $S_{60}$, a difference between the transmittance (%) at an incidence angle of 30° and the transmittance (%) at an incidence angle of 0° is 5% or less for the first wavelength band.

4. The optical filter according to claim 1, wherein the transmission portion contains a UV curable resin, and the absorption portion contains a UV curable resin and a light absorber.

5. The optical filter according to claim 1, wherein the plurality of grooves have a trapezoidal cross section, and have a pitch P1 of 3 μm to 500 μm.

6. A light-emitting device comprising a light source and the optical filter according to claim 1.

* * * * *